United States Patent
Schaefer et al.

(10) Patent No.: US 11,922,063 B2
(45) Date of Patent: Mar. 5, 2024

(54) MEMORY COMMAND VERIFICATION

(71) Applicant: Micron Technology, Inc., Boise, ID (US)

(72) Inventors: Scott E. Schaefer, Boise, ID (US); Aaron P. Boehm, Boise, ID (US)

( * ) Notice: Subject to any disclaimer, the term of this patent is extended or adjusted under 35 U.S.C. 154(b) by 0 days.

(21) Appl. No.: 17/470,594

(22) Filed: Sep. 9, 2021

(65) Prior Publication Data
US 2022/0066701 A1    Mar. 3, 2022

Related U.S. Application Data

(63) Continuation of application No. 16/579,095, filed on Sep. 23, 2019, now Pat. No. 11,132,147.

(60) Provisional application No. 62/746,274, filed on Oct. 16, 2018.

(51) Int. Cl.
*G06F 3/06* (2006.01)
*G06F 9/30* (2018.01)

(52) U.S. Cl.
CPC .......... *G06F 3/0659* (2013.01); *G06F 3/0607* (2013.01); *G06F 3/0658* (2013.01); *G06F 3/0688* (2013.01); *G06F 9/30196* (2013.01)

(58) Field of Classification Search
CPC .............. G06F 11/073; G06F 11/0763; G06F 12/0223; G06F 12/1441; G06F 12/1466; G06F 2201/83; G06F 2212/1032; G06F 2212/7204; G06F 3/0607; G06F 3/0658;
(Continued)

(56) References Cited

U.S. PATENT DOCUMENTS

| | | |
|---|---|---|
| 2007/0143542 A1 | 6/2007 | Watanabe et al. |
| 2007/0277085 A1 | 11/2007 | Goessel et al. |
| 2010/0100660 A1 | 4/2010 | Tamagawa |

(Continued)

FOREIGN PATENT DOCUMENTS

| | | |
|---|---|---|
| CN | 101359513 A | 2/2009 |
| JP | 2002251332 A | 9/2002 |

(Continued)

OTHER PUBLICATIONS

China Patent Office, "First Office Action," issued in connection with China Patent Application No. 201980075919.8, dated Nov. 26, 2021 (16 pages).

(Continued)

*Primary Examiner* — Yong J Choe
(74) *Attorney, Agent, or Firm* — Holland & Hart LLP

(57) ABSTRACT

Methods, systems, and devices for performing memory command verification are described. A system may include a memory device and a memory controller, which may be external (e.g., a host device). The memory device may receive, from the memory controller, a command indicating a type of operation and an address. The memory device may decode the command and execute an operation (e.g., the operation corresponding to the decoded command) at an execution location on the memory device. The system (e.g., the memory device or the memory controller) may determine whether the executed operation and execution location match the type of operation and address indicated in the command, and the system may thereby determine an error associated with the decoding, the execution, or both of the command.

19 Claims, 13 Drawing Sheets

(58) Field of Classification Search
CPC ... G06F 3/0659; G06F 3/0688; G06F 9/30196
See application file for complete search history.

(56) References Cited

U.S. PATENT DOCUMENTS

| | | |
|---|---|---|
| 2011/0145474 A1 | 6/2011 | Intrater |
| 2012/0030531 A1 | 2/2012 | Brewerton et al. |
| 2014/0281686 A1 | 9/2014 | Ware |
| 2015/0149739 A1* | 5/2015 | Seo ..................... G06F 3/0608 711/162 |
| 2015/0268875 A1 | 9/2015 | Jeddeloh |
| 2016/0092293 A1 | 3/2016 | Ishii et al. |

FOREIGN PATENT DOCUMENTS

| | | |
|---|---|---|
| KR | 20140100752 A | 8/2014 |
| WO | 2018175001 A1 | 9/2018 |

OTHER PUBLICATIONS

European Patent Office, "Search Report and Search Opinion", issued in connection with European Patent Application No. 19873601.9 dated Feb. 11, 2022 (8 pages).

ISA/KR, International Search Report and Written Opinion of the International Searching Authority, Int'l. Appl. No. PCT/US2019/054760, dated Jan. 23, 2020, Korean Intellectual Property Office, Seo-gu, Daejeon, Republic of Korea, 1 pgs.

* cited by examiner

MEMORY COMMAND VERIFICATION

CROSS REFERENCE

The present application for patent is a continuation of U.S. patent application Ser. No. 16/579,095 by Schaefer et al., entitled "MEMORY COMMAND VERIFICATION," filed Sep. 23, 2019, which claims priority to U.S. Provisional Patent Application No. 62/746,274 by Schaefer et al., entitled "MEMORY COMMAND VERIFICATION," filed Oct. 16, 2018, each of which is assigned to the assignee hereof and is expressly incorporated by reference in its entirety herein.

BACKGROUND

The following relates generally to a system that includes at least one memory device and more specifically to memory command verification.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Types of memory devices include magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, SRAM, may lose their stored state when disconnected from an external power source. Dynamic memory devices, e.g., DRAM, SDRAM, may lose a stored state over time unless they are periodically refreshed.

In some cases, an external memory controller may communicate commands to a memory device. The command may indicate a type of instruction to be executed at a given location on the memory device. Improving reliability for executing commands at a memory device may be desired.

DETAILED DESCRIPTION

Figure 1:
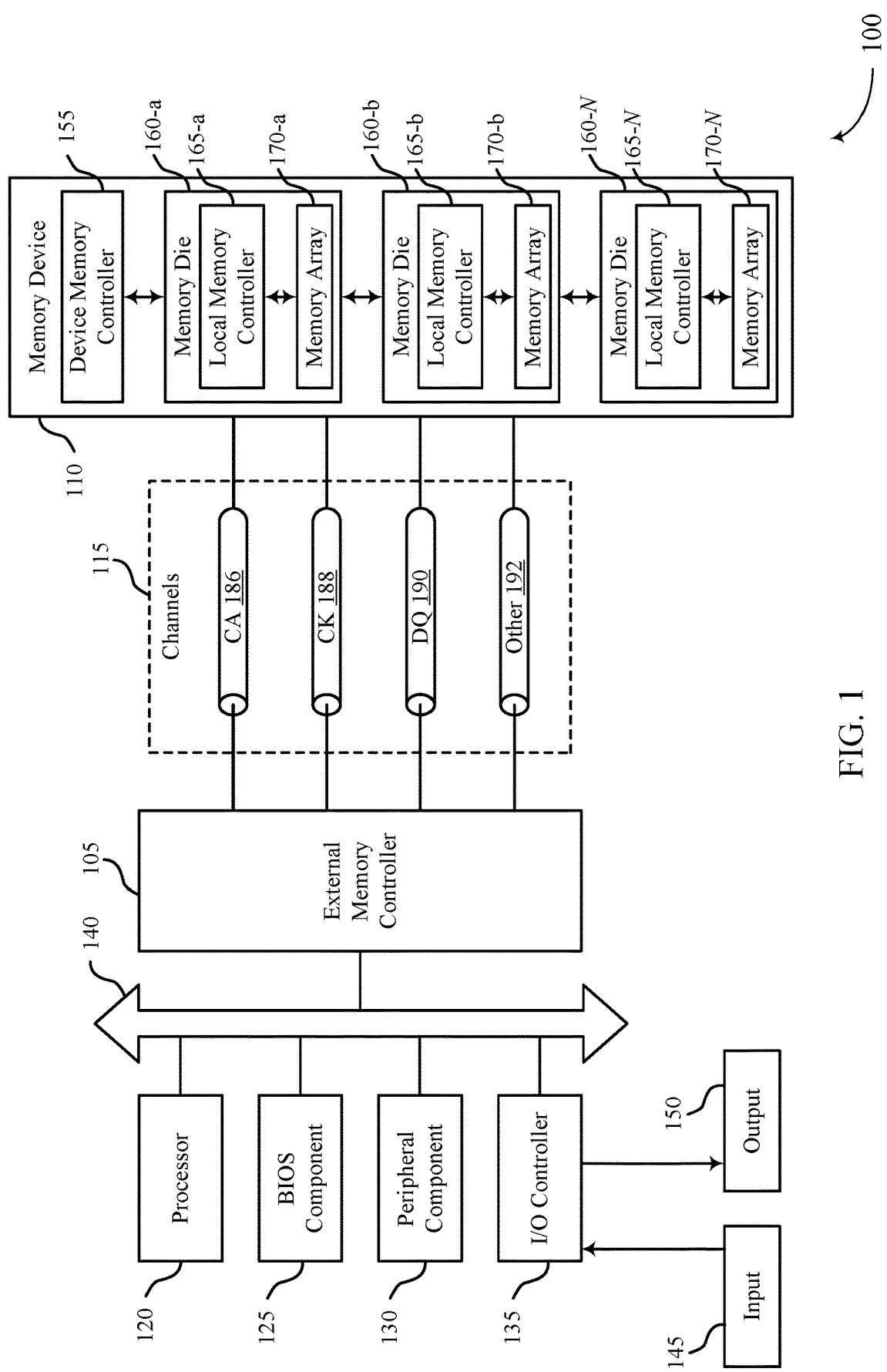
FIG. 1 illustrates an example of a system that supports memory command verification as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry specifications (e.g., higher reliability constraints).

Some memory systems may include a host device (e.g., an external memory controller) which may transmit access commands (e.g., for a read operation, a write operation, a refresh operation) to a memory device. The memory device may receive the command from the host device and decode the command to determine an access instruction and an address (e.g., the access instruction indicating a type of access operation to be performed at the address of the memory device). The memory device may execute the access instruction at an execution address based on the decoded command. In some systems, the host device may not be able to determine errors associated with decoding and/or executing the command. For example, the memory device may determine (and execute) a type of access operation that is different than the type of access operation indicated by the command. Additionally or alternatively, the memory device may determine and/or execute the access operation at an address that is different than the address indicated by the command. A failure to detect such errors by the host device may negatively affect the reliability of the system.

Techniques for memory command verification are described. For example, the system may compare the access instruction and address included in the command to the executed access instruction and execution address to determine errors associated with the decoding and/or the execution of the command (e.g., whether any such error occurs). Determining errors associated with a specific command may allow the host device to retransmit commands not executed properly, thus increasing the reliability of the system. In some cases, the memory device may compare the executed access instruction and execution address to the command and transmit an indication relating to the comparison to the host device. In some other cases, the host device may compare the executed access instruction and execution address to the command.

Features of the disclosure are initially described in the context of memory systems and a memory device with reference to FIGS. 1-4. Features of the disclosure are described in the context of process flows with reference to FIGS. 5-7. These and other features of the disclosure are further illustrated by and described with reference to apparatus diagrams and flowcharts in FIGS. 8-13 that relate to memory command verification.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some examples, system 100 is a graphics card. In some cases, the host device may refer to the hardware, firmware, software, or a combination thereof that implements the functions of the external memory controller 105. In some cases, the external memory controller 105 may be referred to as a host or host device. The external memory controller 105 may communicate access commands to a memory device 110 indicating a type of operation (e.g., a read operation, a refresh operation, a write operation) to be executed at a memory array 170 at a location indicated by an address of the command. In some cases, the external memory controller 105 may be configured to detect errors associated with decoding and/or executing the access command at the memory device 110. In some examples, the memory device 110 may indicate the error to the external memory controller 105. In some other examples, the memory device 110 may transmit information related to the decoding and/or execution of the access command to enable the external memory controller 105 to detect the error.

In some cases, the memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. One or more memory arrays 170 may include a row access logic component and a column access logic component. The row and column access logic components may determine a subset of the memory array 170 accessed during an access operation indicated by the external memory controller 105. In some examples, the subset of the memory array 170 may indicate the subset along one or more dimensions of the array. The memory array 170 may indicate the subset to a device memory controller 155, a local memory controller 165, the external memory controller 105, or a verifier component (e.g., as discussed in more detail with reference to FIGS. 3 and 4). The system may compare the subset to an address indicated by the access operation in order to detect errors associated with decoding and/or executing the access command. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of an M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of an M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
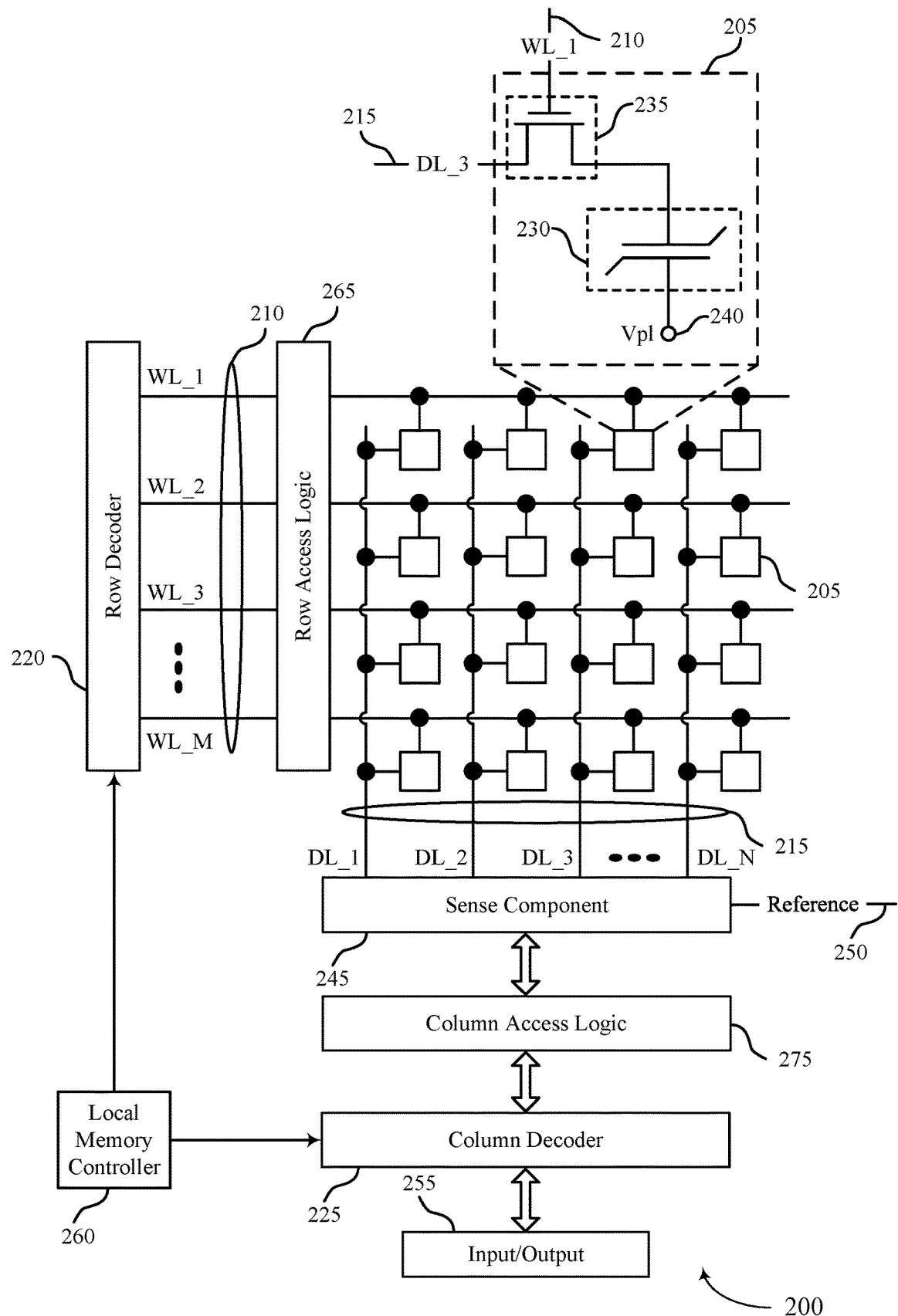
FIG. 2 illustrates an example of a memory sub-array that supports memory command verification as disclosed herein.

FIG. 2 illustrates an example of a memory sub-array 200 in accordance with various examples of the present disclosure. The memory sub-array 200 may be an example of at least a portion of the memory dice 160 described with reference to FIG. 1. In some cases, the memory sub-array 200 may be referred to as a memory die, memory chip, a memory device, or an electronic memory apparatus. For example, a memory device such as a memory chip may include multiple instances of sub-array 200, with additional row, address, bank, or bank group decoding used to select one or more sub-arrays from the multiple instances for access operations. The memory sub-array 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line or configuring a multiplexer to map the line to a given signal.

The memory sub-array 200 may include the access lines (e.g., the word lines 210 and the digit lines 215) arranged in a grid-like pattern. Memory cells 205 may be positioned at intersections of the word lines 210 and the digit lines 215. By biasing a word line 210 (e.g., applying a voltage to the word line 210), a memory cell 205 may be accessed via the digit line 215 at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory sub-array 200 may include multiple word lines 210, labeled WL_1 through WL_M, and multiple digit lines 215, labeled DL_1 through DL_N, where M and N depend on the size of the memory array. Thus, by activating a word line 210, e.g., WL_1, the memory cells 205 in a given row may be accessed. The digit lines 215 (e.g., DL_1, . . . , DL_N) carry the data for writing or reading from the memory cells in the row. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

The memory sub-array 200 may include row access logic 265. The row access logic 265 may be coupled to the word lines 210 or to portions of row decoder 220. The row access logic 265 may be configured to determine a word line 210 that is activated during an access operation. In some cases, the row access logic 265 may determine a single word line 210 that is activated during the access operation. In some other region, the row access logic 265 may determine a subset of word lines 210 including the word line that is activated during the access operation. The row access logic 265 may be configured to transmit an indication of the word line or lines 210 that are activated during the access operation to a component (e.g., a verifier as described herein 235).

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. The memory sub-array 200 may include column access logic 275. The column access logic 275 may be coupled to the column decoder 225 or the sense component 245. The column access logic 275 may be configured to determine a digit line 215 that is selected during an access operation. In some cases, the column access logic 275 may determine a single digit line 215 that is selected during the access operation. In some other cases, the column access logic 275 may determine a subset of digit lines 215 that are selected (or that include one or more digit lines that are selected) during the access operation. The column access logic 275 may be configured to transmit an indication of the digit line or lines 215 that are selected during the access operation to a component (e.g., a verifier as described herein).

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., via charge sharing) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include amplifiers (e.g., transistor amplifiers) to detect and amplify a difference in the signals. The detected logic state of memory cell 205 may be output through column decoder 225 as output 255. In some cases, the aspects of sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, aspects of the row decoder 220, column decoder 225, or sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory sub-array 200, perform one or more operations on the memory sub-array 200, and communicate data from the memory sub-array 200 to the external memory controller 105 (or the device memory controller 155) in response to performing the one or more operations. The local memory controller 260 may generate row and column address signals to activate the target word line 210 and select the target digit line 215. The local memory controller 260 may also generate and control various voltages or currents used during the operation of the memory sub-array 200. In general, the amplitude, shape, or duration of an applied voltage or current discussed herein may be adjusted or varied and may be different for the various operations discussed in operating the memory sub-array 200.

In some cases, the local memory controller 260 may be configured to perform a write operation (e.g., a programming operation) on one or more memory cells 205 of the memory sub-array 200. During a write operation, a memory cell 205 of the memory sub-array 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

The row access logic 265 and the column access logic 275 may determine a subset of the array corresponding to the target memory cell 205. That is, the row access logic 265 and the column access logic 275 may be configured to determine the word line or lines 210 activated by the write operation and the digit line or lines 215 that convey data associated with the write operation. The row access logic 265 and the column access logic 275 may transmit an indication of the determined subset of the array (e.g., to a verifier as discussed herein). In some examples, the indication of the subset of the array may indicate the subset along one or more dimensions of the array. For example, the indication of the subset of the array may indicate the word line or lines 210 being activated during the write operation (e.g., a row matrix (MAT) indication). Additionally or alternatively, the indication of the subset of the array may indicate the digit line or lines 215 selected during the write operation (e.g., a column MAT indication).

In some cases, the local memory controller 260 may be configured to perform a read operation (e.g., a sense operation) on one or more memory cells 205 of the memory sub-array 200. During a read operation, the logic state stored in a memory cell 205 of the memory sub-array 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation (e.g., by selecting data read from digit lines 215 using column decoder 225).

The row access logic 265 and the column access logic 275 may determine a subset of the array corresponding to the target memory cell 205. That is, the row access logic 265 and the column access logic 275 may be configured to determine the word line or lines 210 activated during the read operation and the digit line or lines 215 carrying the data associated with the read operation. The row access logic 265 and the column access logic 275 may transmit an indication of the determined subset of the array (e.g., to a verifier as discussed herein). In some examples, the indication of the subset of the array may indicate the subset along one or more dimensions of the array. For example, the indication of the subset of the array may indicate the word line or lines 210 being activated during the read operation (e.g., a row MAT indication). Additionally or alternatively, the indication of the subset of the array may indicate the digit line or lines 215 selected during the read operation (e.g., a column MAT indication).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
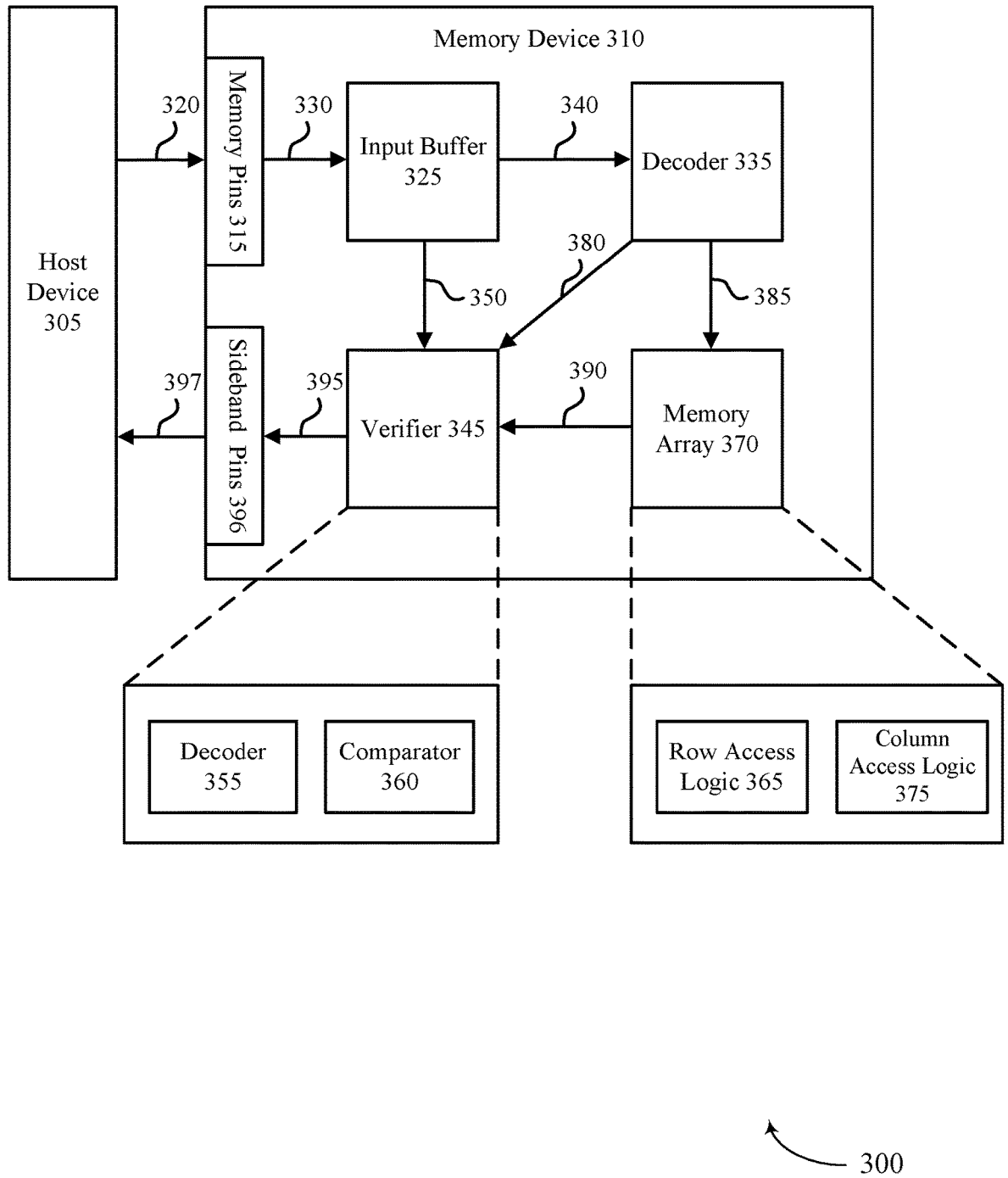
FIGS. 3 and 4 illustrate examples of systems that support memory command verification as disclosed herein.

FIG. 3 illustrates an example of a system 300 that supports techniques for memory command verification for a memory device. The system 300 may include one or more components described herein with reference to FIGS. 1 and 2. For example, the system 300 may include a host device 305, which may be an example of the external memory controller 105 as described with reference to FIG. 1; a memory device 310, which may be an example of the memory device 110, the memory dice 160, or the memory sub-array 200 as described with reference to FIGS. 1 and 2; and a memory array 370, which may be an example of a memory array 170 as described with reference to FIG. 1 and may include aspects of memory sub-array 200 as described with reference to FIG. 2. The memory device 310 may also include the memory pins 315, an input buffer 325, and a verifier 345.

Host device 305 may send a command via a channel 320, which may be an example of a channel 115 or CA channel 186 as discussed with reference to FIG. 1. The command may include an instruction for an access operation (e.g., a read operation, a refresh operation, a write operation) at memory array 370 on the memory device 310. The command may further include an address of the memory array 370 targeted by the access operation. The address may comprise a row address and a column address corresponding to a row and column(s) of the memory array 370. The memory device 310 may utilize a verifier 345 in order to determine (e.g., identify, detect) errors associated with the transferring, decoding, or execution of the command received from the host device 305. In some cases, determining the errors may improve the reliability of the system 300. For example, the host device 305 may retransmit the command or commands for which the memory device 310 determined an error, or may otherwise process additional commands to recover from the error.

Upon receiving the command at the memory pins 315, the memory device 310 may latch (e.g., capture) the command at the input buffer 325 via bus 330. The command may comprise raw pin data detected at the memory pins 315 from the channel 320. The memory device 310 may transfer the command from the input buffer 325 to the decoder 335 (e.g., via bus 340), where the decoder 335 may attempt to decode the command into an access instruction and an address (e.g., the access instruction indicating a type of access operation to be performed at the address of the memory array 370). In some cases, there may be an error when the memory device 310 transfers the command from the input buffer 325 and/or attempts to decode the command at decoder 335. For example, the command may not be transferred correctly from the input buffer 325 to the decoder 335. That is, the raw pin data (e.g., indicating the command) received at the decoder 335 may not match the data transmitted across channel 320 from the host device 305 (e.g., the data received at the input buffer 325). In another example, the decoder 335 may incorrectly decode the command and therefore may not determine a correct access instruction and/or address.

Verifier 345 may be configured to detect such errors. The memory device 310 may transmit data corresponding to the access instruction (e.g., as determined based on decoding the command) from the decoder 335 to the verifier 345 (e.g., via a bus 380). In some cases, the data may indicate a success (or lack thereof) of decoding the command to determine an access instruction. That is, the data may indicate an error resulting in the decoder 335 not determining a type of access instruction based on the command (e.g., not successfully decoding the command). For example, the decoder 335 may transmit a logic '0' on the bus 380 in the event that an access instruction was determined from the command. Conversely, the decoder 335 may transmit a logic '1' on the bus 380 in the event that an access instruction was not determined from the command (e.g., corresponding to a failed decoding by decoder 335). In some other cases, the data may indicate the type of access instruction determined by the decoder 335. For example, the decoder 335 may transmit a signal (or multiple signals) to the verifier 345 that may map to (e.g., identify) the type of access instruction (e.g., a read instruction, a refresh instruction, a write instruction).

In the case where the decoder 335 transmits the type of access instruction to the verifier 345, the verifier 345 may determine if the type of access instruction determined at the decoder 335 matches a type of access instruction indicated by the command stored at the input buffer 325. Here, the verifier 345 may also receive the command stored at the input buffer 325 (e.g., corresponding to the raw pin data received at the memory pins 315) via bus 350. The verifier may decode, by a second decoder 355, the command received from the input buffer 325. In some cases, the decoder 355 may decode the command and determine a type of access instruction (e.g., in a similar manner as decoder 335). The verifier 345 may compare the type of access instruction determined at the decoder 355 to the type of access instruction determined at decoder 335 (e.g., by comparator 360). By this method, the verifier 345 may determine if there is an error associated with the access instruction determined at the decoder 335 (e.g., if the comparator 360 determines that the two access instruction types are different).

After decoding the command received from the input buffer 325, the decoder 335 may subsequently indicate the instruction and the address to the memory array 370 (e.g., via the bus 385). The memory array 370 may access the memory array 370 at the indicated address and according to the indicated instruction (e.g., an instruction corresponding to a read operation, a refresh operation, a write operation). For example, the memory array 370 may include a row decoder and a column decoder (e.g., as described with reference to FIG. 2) configured to receive an address for memory array 370 and activate a word line and select digit lines respectively based on the received address (e.g., as received from the decoder 335). The memory array 370 may further include row access logic 365 and column access logic 375 configured to determine an accessed portion of the memory array 370 accessed during the execution of the indicated instruction. For example, as described with reference to FIG. 2, the row access logic 365 may determine a word line or a set of word lines accessed by the memory array 370. The word line or word lines accessed may correspond to an accessed row MAT. Additionally or alternatively, the column access logic 375 may determine a digit line or a set of digit lines accessed by the memory array 370. The digit line or digit lines accessed may correspond to an accessed column MAT. The accessed row MAT and/or the access column MAT may correspond to the accessed portion of the memory array 370.

There may be an error corresponding to the location of the memory array 370 during the access operation. For example, the decoder 335 may incorrectly decode the command and determine an address for the access command that does not correspond to an address indicated by the command received from the host device 305. In another example, the memory array 370 may incorrectly access a word line and/or digit line. For example, a row decoder and/or a column decoder may activate an incorrect word or select an incorrect digit line (e.g., a different word or digit line than indicated by the address within the command received from the host device 305).

Verifier 345 may be configured to detect such errors (e.g., via bus 390). The memory array 370 may transmit an indication of the accessed portion (e.g., as determined by the row access logic 365 and/or the column access logic 375) to the verifier 345. The indication may include an identifier for the accessed portion (e.g., a row identifier, a column identifier, a row MAT identifier, a column MAT identifier). A row MAT may refer to a single word line, a subset of word lines of one or more sub-arrays, a sub-array, or the like. A column MAT may refer to a single digit line, a subset of digit lines of one or more sub-arrays, a sub-array, or the like.

The verifier 345 may receive the command from the input buffer 325. As discussed above, the verifier 345 may utilize a second decoder 355. In some cases, the second decoder 355 may be different than decoder 335. For example, the decoder 335 may be optimized for decoding speed to support timing of various memory operations, while the decoder 355 may be optimized for robustness. In some cases, decoder 335 may be a custom logic or transistor level circuit, while decoder 355 may be a synthesized logic block (e.g., synthesized from a hardware description language). In some cases, the decoder 335 may use switched logic gates while, decoder 355 uses static combinatorial logic gates. In a first example, the decoder 355 may decode the command received from the input buffer 325 to determine an instruction and an expected address of the memory array 370. In this example, the verifier 345 may compare the expected address determined at the second decoder 355 to the accessed portion indicated by the memory array 370 (e.g., at comparator 360). The verifier 345 may determine an error in the event that the accessed portion does not match a portion of the memory array 370 indicated by the expected address. Here, the memory device 310 may determine that the executed command (e.g., executed according to the address determined by the first decoder 335 which may be different than the address determined by the second decoder 355 and/or row or column decoders in memory array 370) may not have been executed properly.

In a second example, the decoder 355 may map the command received from the input buffer 325 to determine an expected portion of the memory array 370 containing the address indicated by the command (e.g., without determining the decoded address itself). That is, the portions of the memory array 370 (e.g., row MAT, column MAT) may be related to a physical structure of the memory array 370 and may not directly correspond to the decoded address. Thus, the decoded address may correspond to a logical or virtual address space, while the accessed portion of the memory array 370 may be represented in a physical address space. Here, the decoder 355 may map the command to an expected portion of the memory array 370. The expected portion may include an expected row MAT, an expected column MAT, or an expected array (e.g., an expected column MAT and an expected row MAT). In this example, the verifier 345 may compare the expected portion determined at the second decoder 355 to the accessed portion indicated by the memory array 370 (e.g., at comparator 360). The verifier 345 may determine an error in the event that the expected portion determined by the second decoder 355 does not correspond to the accessed portion indicated by the memory array 370. Here, the memory device 310 may determine that the executed command may not have been executed properly.

In the event that memory device 310 detects an error corresponding to the instruction and/or the location accessed by the instruction, the verifier 345 may indicate the error to the host device 305 (e.g., via bus 395). In some cases, in the event the memory device determines an error (such as incorrectly decoding the command, failing to decode the command, accessing a portion of the memory array 370 that does not match a portion of the memory array 370 indicated by the command), the memory device 310 may indicate the error at the sideband pins 396 (e.g., by activating a pin by the verifier 345 via bus 395). For example, raising the voltage of the pin to a logic '1' may indicate an error occurred during the execution of the received command while keeping the voltage of the pin at a ground voltage (e.g., a logic '0') may indicate that memory device 310 has not detected an error occurring during the execution of one or more commands. Alternatively, the logic states for the indication could be inverted from this example.

In another example, the verifier 345 may transmit additional data via bus 395, sideband pins 396, and bus 397. The sideband pins 396 may be a serial bus such that the verifier 345 sends the data serially via the sideband pins 396 and bus 397. The additional data may include the one or more of a success or failure for decoding the command by decoder 335, the access instruction type determined by the decoder 335, or the accessed portion of the memory array 370. In some cases, the additional data may allow the host device 305 to determine status of the execution of the command at the memory device 310. For example, the host device 305 may compare the access instruction type determined by the decoder 335 or the accessed portion of the memory array 370 to the intended instruction type or address. The host device 305 may process additional commands based on the status of execution of the command. For example, the host device 305 may determine to retransmit the command based on receiving an error indication from the memory device 310. This may allow the host device 305 to improve reliability of the memory device 310 when compared to a memory device that does not provide such error feedback.

In some cases, the host device 305 may transmit a stream of commands to the memory device 310. In this example, the memory device 310 may concurrently execute the transmitted commands as well as determine errors associated with the execution of one or more of the commands. That is, the communications and operations done at the verifier 345 may not disrupt the operations (e.g., normal memory access operations) of the memory device 310. This may allow the memory device 310 to provide additional feedback to the host device 305 (e.g., increasing reliability of the memory device 310) without decreasing (e.g., significantly or at all) read/write speeds of the memory device.

Figure 4:
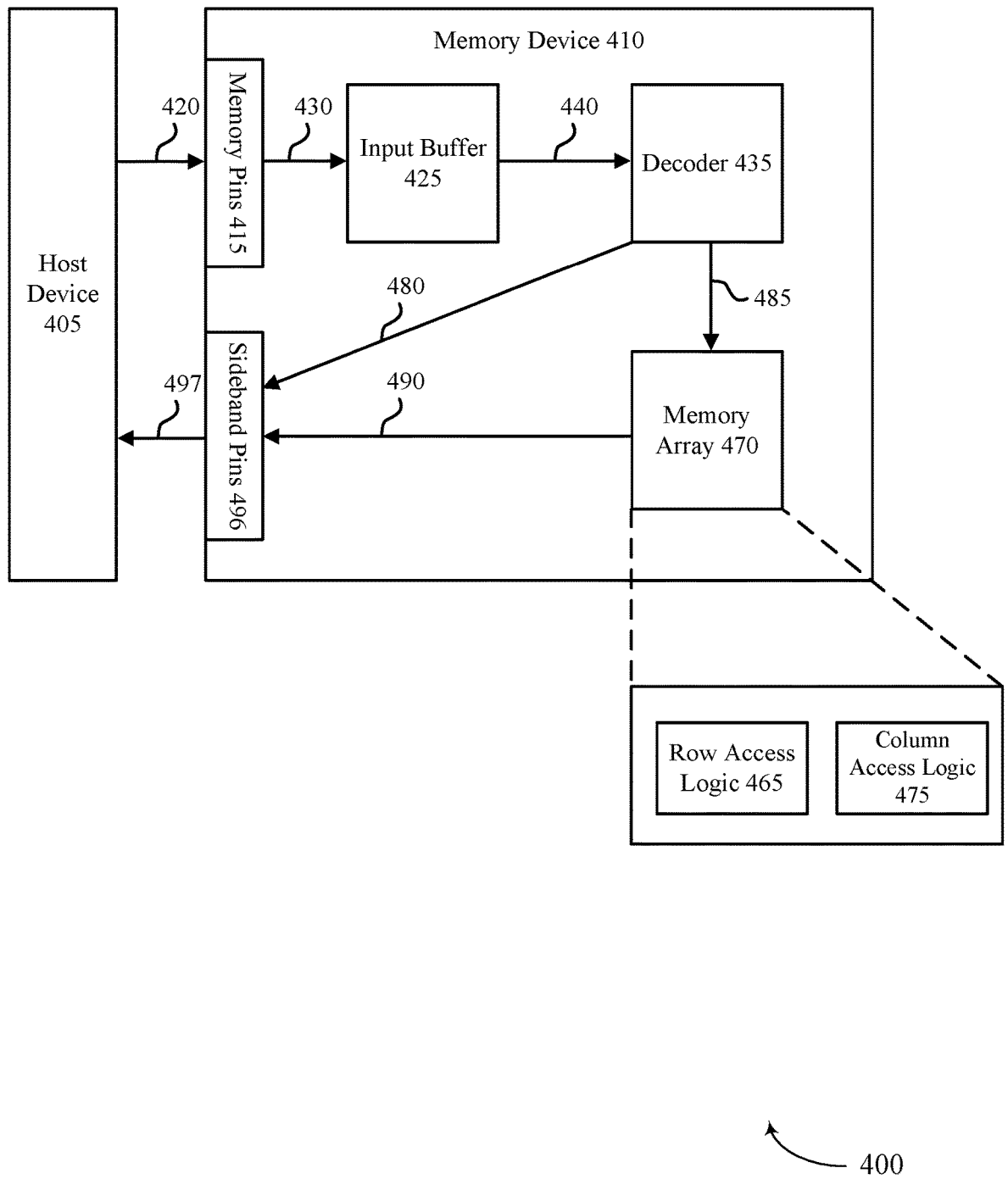

FIG. 4 illustrates an example of a system 400 that supports techniques for memory command verification for a memory device. The system 400 may include one or more components described herein with reference to FIGS. 1 and 2. For example, the system 400 may include a host device 405, which may be an example of the external memory controller 105 as described with reference to FIG. 1; a memory device 410, which may be an example of the memory device 110, the memory dice 160, or the memory sub-array 200 as described with reference to FIGS. 1 and 2; and a memory array 470, which may be an example of a memory array 170 as described with reference to FIG. 1 and may include aspects of memory sub-array 200 as described with reference to FIG. 2. The memory device 410 may also include the memory pins 415, and an input buffer 425.

Host device 405 may send a command via a channel 420, which may be an example of a channel 115 or CA channel 186 as discussed with reference to FIG. 1. The command may include an instruction for an access operation (e.g., a read operation, a write operation) at a memory array 470 on the memory device 410. The command may further include an address of the memory array 470 targeted by the access operation. The address may comprise a row address and a column address corresponding to a row and column at the memory array 470. The memory device 410 may indicate, to the host device 405, information related to a decoding of the command and/or information related to a portion of the memory array 470 accessed during an execution of the command. The indicated information may allow host device 405 to determine errors associated with transferring, decoding, and/or executing the command received from the host device 405. In some cases, determining the errors may improve the reliability of the system 400. For example, the host device 305 may retransmit the command or commands for which the host device 405 determined an error, or may otherwise process additional commands to recover from the error.

Upon receiving the command at the memory pins 415, the memory device 410 may latch the command at the input buffer 425 via bus 430. The command may comprise raw pin data detected at the memory pins 415 from the bus 420. The memory device 410 may transfer the command from the input buffer 425 to the decoder 435 (e.g., via bus 440), where the decoder 435 may attempt to decode the command into an access instruction and an address (e.g., the access instruction indicating a type of access operation to be performed at the address of the memory array 470). In some cases, there may be an error when the memory device 410 transfers the command from the input buffer 425 and/or attempts to decode the command at decoder 435. For example, the command may not be transferred correctly from the input buffer 425 to the decoder 435. That is, the raw pin data (e.g., indicating the command) received at the decoder 435 may not match the data transmitted across channel 420 from the host device 405 (e.g., the data received at the input buffer 425). In another example, the decoder 435 may incorrectly decode the command and therefore may not determine a correct access instruction and/or address.

The memory device 410 may transmit data corresponding to the access instruction (e.g., as determined based on decoding the command) from the decoder 435 to the sideband pins 496 (e.g., via a bus 480). The sideband pins 496 may be a serial bus such that the decoder 435 sends the data serially via the sideband pins 496 and bus 497. In some cases, the data may indicate a success (or lack thereof) of decoding the command to determine an access instruction. That is, the data may indicate an error resulting in the decoder 435 not determining a valid type of access instruction based on the command (e.g., not successfully decoding the command) or not determining a valid address from the command. For example, the decoder 435 may transmit a logic '0' on the bus 480 in the event that an access instruction and valid address was determined from the command. Conversely, the decoder 435 may transmit a logic '1' on the bus 480 in the event that an access instruction was not determined from the command (e.g., corresponding to a failed decoding by decoder 435). Alternatively the logic states for successfully decoding the command may be inverted. In some other cases, the data may indicate the type of access instruction determined by the decoder 435. For example, the decoder 435 may transmit a bit (or a series of bits) to the sideband pins 496 that may map to the type of access instruction (e.g., a read instruction, a write instruction).

In the case where the decoder 435 transmits the type of access instruction to the sideband pins 496, the host device 405 may determine if the type of access instruction determined at the decoder 435 matches a type of access instruction indicated by the command transmitted by the host device 405. Here, the host device 405 may receive an indication of the type of access command determined at the decoder 435. The host device 405 may compare the type of access instruction indicated via the sideband pins 496 to the type of access instruction indicated by the command transmitted by the host device 405. By this method, the host device 405 may determine if there is an error associated with the access instruction determined at the decoder 435.

After decoding the command received from the input buffer 425, the decoder 435 may subsequently indicate the instruction and the address to the memory array 470 (e.g., via the bus 485). The memory array 470 may be accessed at the indicated address and according to the indicated instruction (e.g., an instruction corresponding to a read operation, a write operation). For example, the memory array 470 may include a row decoder and a column decoder (e.g., as described with reference to FIG. 2) configured to receive an address for memory array 470 and activate a word line and select digit lines respectively based on the received address (e.g., as received from the decoder 435). The memory array 470 may further include row access logic 465 and column access logic 475 configured to determine an accessed portion of the memory array 470 accessed during the execution of the indicated instruction. For example, as described with reference to FIG. 2, the row access logic 465 may determine a word line or a set of word lines accessed by the memory array 470. The word line or word lines accessed may correspond to an accessed row MAT. Additionally or alternatively, the column access logic 475 may determine a digit line or a set of digit lines accessed by the memory array 470. The digit line or digit lines accessed may correspond to an accessed column MAT. The accessed row MAT and/or the access column MAT may correspond to the accessed portion of the memory array 470.

There may be an error corresponding to the location of the memory array 470 during the access operation. For example, the decoder 435 may incorrectly decode the command and determine an address for the access command that does not correspond to an address indicated by the command received from the host device 405. In another example, the memory array 470 may incorrectly access a word line and/or digit line. For example, a row decoder and/or a column decoder may activate an incorrect word line or select incorrect digit lines (e.g., a different word or digit line than indicated by the address within the command received from the host 405).

The memory device 410 may transmit (e.g., via bus 490, sideband pins 496, and bus 497) information related to the accessed portion of the memory array 470 to enable the host device 405 to determine such errors. The memory device 410 may transmit an indication of the accessed portion of the memory array 470 (e.g., as determined by the row access logic 465 and/or the column access logic 475). The indication may include an identifier for the accessed portion (e.g., a row identifier, a column identifier, a row MAT identifier, a column MAT identifier). In one example, the accessed portion may correspond to a row MAT. In some other examples, the accessed portion may correspond to a row MAT and a column MAT. In another example, the accessed portion may correspond to an intersection of a single word line and a single digit line (e.g., a single memory cell).

The host device 405 may receive the command from the sideband pins 496. The host device 405 may use circuitry (e.g., a LUT) in order to map the command, transmitted to the memory device 410, to an expected portion of the memory array 470. The expected portion may include an expected row MAT, an expected column MAT, or an expected array location (e.g., an expected column MAT and/or an expected row MAT). The host device 405 may compare the expected portion to the accessed portion indicated by the memory array 470. The host device 405 may determine an error in the event that the expected portion does not correspond to the accessed portion indicated by the memory array 470. Here, the memory device 410 may determine that the executed command may not have been executed properly.

The host device 405 may receive information allowing the host device 405 to determine errors such as the memory device 410 incorrectly decoding the command, the memory device 410 failing to decode the command, or the memory device 410 accessing a portion of the memory array 470 that does not match a portion of the memory array 470 indicated by the command from the host device 405. The host device 405 may determine to retransmit the command based on receiving the information. This may allow the host device 405 to improve reliability of the memory device 410 when compared to a memory device that does not provide such error feedback. In some cases, the host device 405 may transmit a stream of commands (e.g., multiple commands that are transmitted contiguously or non-contiguously to each other) to the memory device 410. In this example, the memory device 410 may execute the transmitted commands concurrently to transmitting information allowing the host device 405 to determine errors associated with one or more of the stream of commands. That is, normal memory operations may continue concurrently with sending information from the memory device 410 to the host device 405 that indicates decoding status for commands, decoded instructions, decoded addresses, or accessed portions of the memory array 470. This may allow the memory device 410 to provide additional information to the host device 405 (e.g., information related to increasing reliability of the memory device 410) without significantly decreasing read/write speeds of the memory device.

Figure 5:
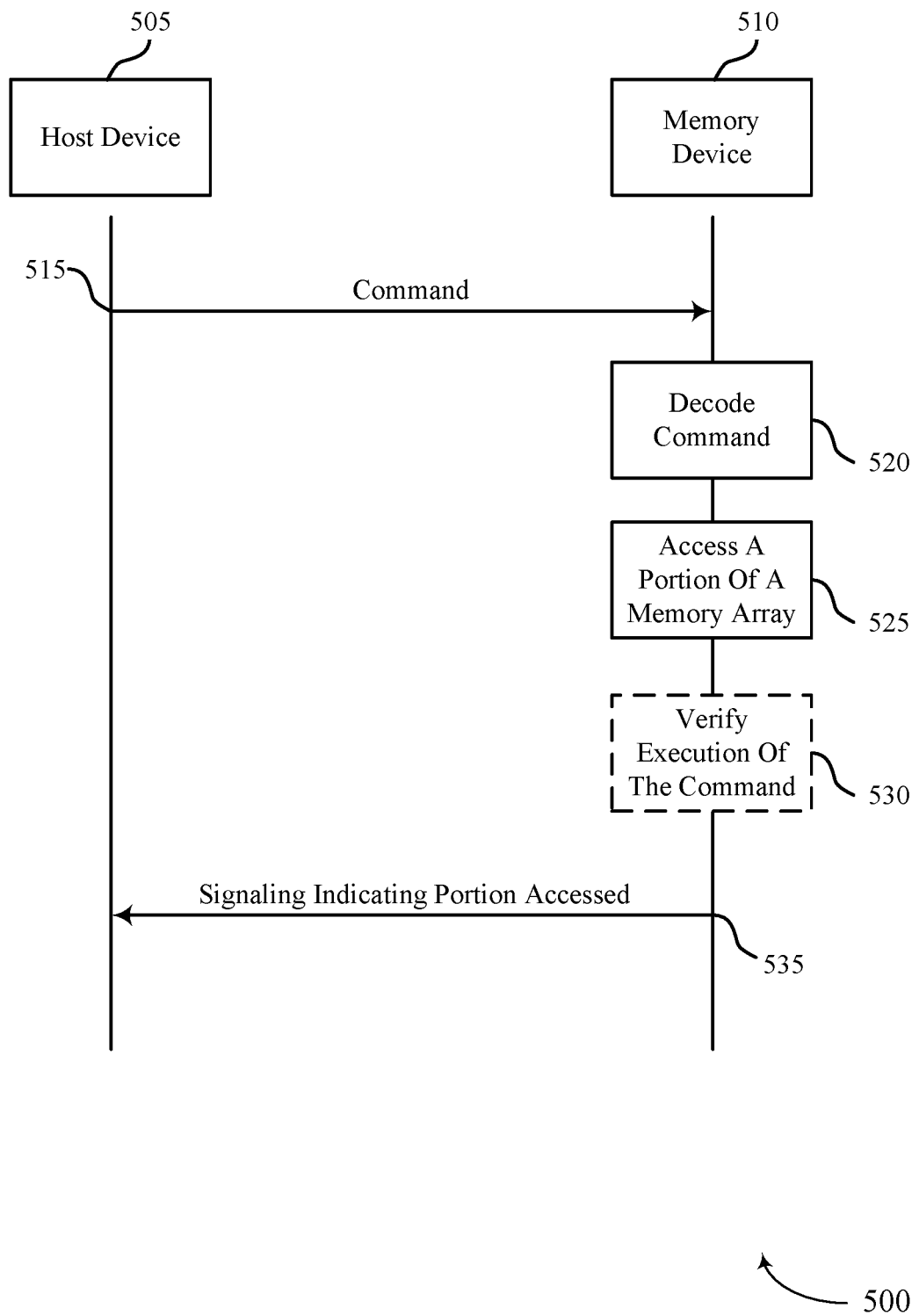
FIGS. 5 through 7 illustrate examples of timing diagrams that support memory command verification as disclosed herein.

FIG. 5 illustrates an example of a process flow 500 that supports techniques for memory command verification for a memory device. The process flow 500 may implement aspects of the systems 100, 300, and 400, and memory sub-array 200. The process flow 500 may include operations performed by a host 505, which may be an example of host devices 305 or 405 as described with reference to FIGS. 3 and 4. Host device 505 may implement aspects of the external memory controller 105 as described with reference to FIG. 1; The process flow 500 may further include operations performed by a memory device 510, which may be an example of the memory device 110, the memory dice 160, or the memory sub-array 200 as described with reference to FIGS. 1 and 2, and may be examples of memory devices 310 and 410 as described with reference to FIGS. 3 and 4.

At 515, the host device 505 may transmit a command to the memory device 510.

At 520, the memory device 510 may decode the command. In some cases, the memory device 510 may further generate an identifier for the command based on decoding the command. The memory device 510 may decode the command at one or more decoders.

At 525, the memory device 510 may access a portion of the memory array of the memory device 510 in response to the command. Accessing the portion of the memory array may be based on decoding the command at 520. The memory device 510 may further generate an identifier of the portion of the memory array accessed in response to the command. The identifier may be generated at the memory array. In some cases, the identifier may include an identifier for one or more dimensions of the memory array (e.g., identifying a row MAT, a column MAT, and/or both). In some examples, the identifier may include an indication of an MAT or sub-array of the memory array (e.g., identifying an intersection of a row MAT and a column MAT).

At 530, the memory device 510 may optionally verify the execution of the command. Here, the memory device 510 may decode the command received from the host device 505 at one or more verifiers. In some cases, the memory device 510 may compare the identifier of the portion of the memory array to the command to the command received from the host device 505. In some other cases, the memory device may optionally compare the identifier for the command (e.g., as determined at 520) to the command received from the host device 505. In some cases, the command identifier may be generated at one or more decoders of the memory device.

At 535, the memory device 510 may transmit signaling indicating the portion of the memory array accessed in response to the command. In some cases (e.g., in the case that the memory device 510 compares the identifier of the portion of the memory array to the command received from the host device 505 at 530), the signaling indicating the portion of the memory array accessed in response to the command may be based on the comparison. For example, the signaling may indicate that the portion of the memory array accessed is different than a portion of the memory array indicated by the identifier of the portion of the memory array. Additionally or alternatively, the signaling may indicate that the portion of the memory array accessed is the same as a portion of the memory indicated by the identifier of the portion of the memory array. The signaling may include an indication of the MAT or sub-array of the memory array accessed in response to the command.

In some examples (e.g., in the case that the memory device 510 compares the identifier determined at one or more decoders to the command received from the host device 505 at 530), the signaling may be based on the comparison. For example, the signaling may indicate that the identifier determined at one or more decoders corresponds to a same type of instruction as indicated by the command received from the host device 505. In another example, the signaling may indicate that the identifier determined at one or more decoders corresponds to a different type of instruction than indicated by the command received from the host device 505. Here, the signaling may indicate whether the command received at the memory device 510 was executed correctly or incorrectly within the memory device 510 (e.g., whether the type of command determined at the one or more decoders is the same as the type of command indicated by the command received from the host device 505). In some instances, the signaling may be based on a comparison of decodes (e.g., a decode at a decoder and a decode at a verifier).

In some cases, the host device 505 may transmit a second command to the memory device 510. The command and second command may be transmitted as part of a sequence (e.g., contiguously or non-contiguously). In some examples, sending the signaling at 535 may not disrupt a normal processing of the command and second command (e.g., the signaling at 535 may be done concurrently with the normal processing). The memory device 510 may transmit a second signaling to the host device 505 indicating that decoding of the second command failed to access the memory array.

Figure 6:
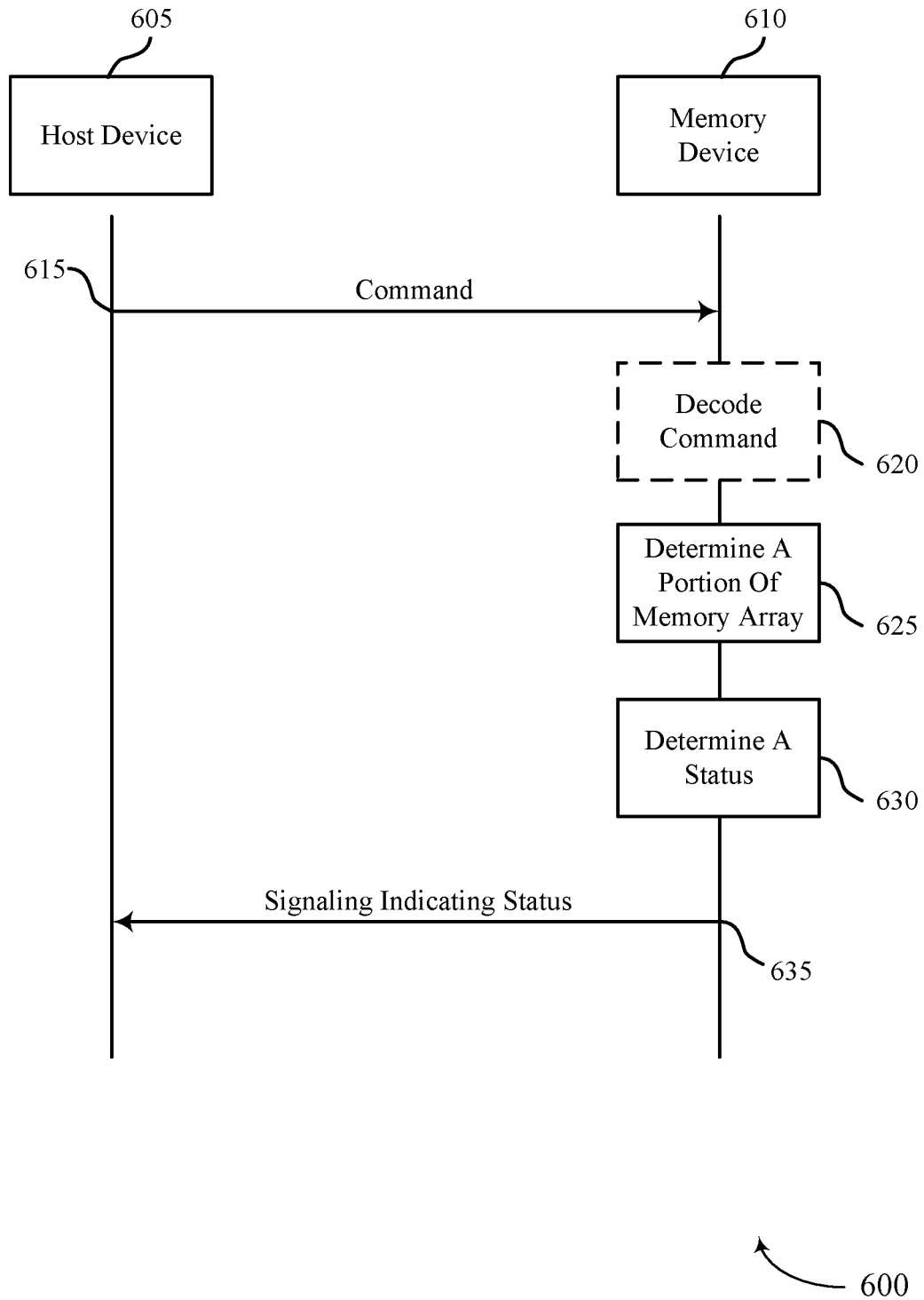

FIG. 6 illustrates an example of a process flow 600 that supports techniques for memory command verification for a memory device. The process flow 600 may implement aspects of the systems 100, 300, and 400, memory sub-array 200, and process flow 500. The process flow 600 may include operations performed by a host 605, which may be an example of host devices 305, 405, or 505 as described with reference to FIGS. 3 through 5. Host device 605 may implement aspects of the external memory controller 105 as described with reference to FIG. 1; The process flow 600 may further include operations performed by a memory device 610, which may be an example of the memory device 110, the memory dice 160, or the memory sub-array 200 as described with reference to FIGS. 1 and 2, and may be examples of memory devices 310, 410, and 510 as described with reference to FIGS. 3 through 5.

At 615, the memory device 610 may receive a command from the host device 605.

At 620, the memory device may optionally decode the command.

At 625, the memory device 610 may determine a portion of the memory that is accessed based on the command received from the host device 605. Here, the memory device 610 may determine a MAT or sub-array of the memory array corresponding to the portion of the memory array accessed in response to the command. The memory device 610 may determine the MAT or sub-array by determining a set of columns of the memory array corresponding to the portion of the memory array accessed in response to the command. The memory device 610 may further determine a set of rows of the memory array corresponding to the portion of the memory array accessed in response to the command. Here, the MAT or sub-array may be based on the set of columns and the set of rows. In some cases (e.g., in the case that the memory device 610 decodes the command at 620), the memory device 610 may determine the portion of the memory that is accessed based on decoding the command.

At 630, the memory device 610 may determine a status associated with the command based on the portion of the memory array that is accessed and the command received at the memory device. Determining the status associated with the command may be based on the MAT or the sub-array of the memory array (e.g., as determined at 625). In some cases, the memory device 610 may determine the status by determining a location of the memory array intended to be accessed by the command sent by the host device 605. The memory device 610 may compare the portion of the memory array accessed based on decoding the command to the location intended to be accessed by the command. The status determined at 630 may be based on the comparing the portion of the memory array accessed based on decoding the command to the location intended to be accessed by the command.

In some cases, the memory device 610 may determine the status by determining, based on the command received from the host device 605, an instruction for the access of the memory array. The memory device 620 may further determine a type of access for the portion of the memory array accessed based at least in part on decoding the command. The status determined at 630 may be based on the comparing the type of access to the instruction.

At 635, the memory device 610 may transmit a signaling to the host device 605 indicating the status associated with the command (e.g., as determined at 630). In a first example, the signaling indicates a status related to the portion of the memory array accessed. In some cases, the memory device 610 may indicate an error for the command in the signaling. The error may be based on determining a mismatch between the portion of the memory array accessed in response to the command and the location intended to be accessed by the command. In some other cases, the memory device 610 may transmit a confirmation for the command in the signaling.

The confirmation may be based on determining that the portion of the memory array accessed in response to the command matches the location intended to be accessed by the command.

In a second example (which may be in addition to or alternatively to the first example), the signaling indicates a status related to the type of access. In some cases, the memory device 610 may transmit an error as part of the signaling. The error may be based on determining a mismatch between the type of access and the instruction (e.g., at 630). In some other cases, the memory device 610 may transmit a confirmation for the command as part of the signaling. The confirmation may be based on determining that the type of access matches the instruction (e.g., at 630).

In some cases, the memory device 610 may receive a second command from the host device 605. The memory device 610 may transmit, to the host device 605, an indicator of a failure to decode the second command.

Figure 7:
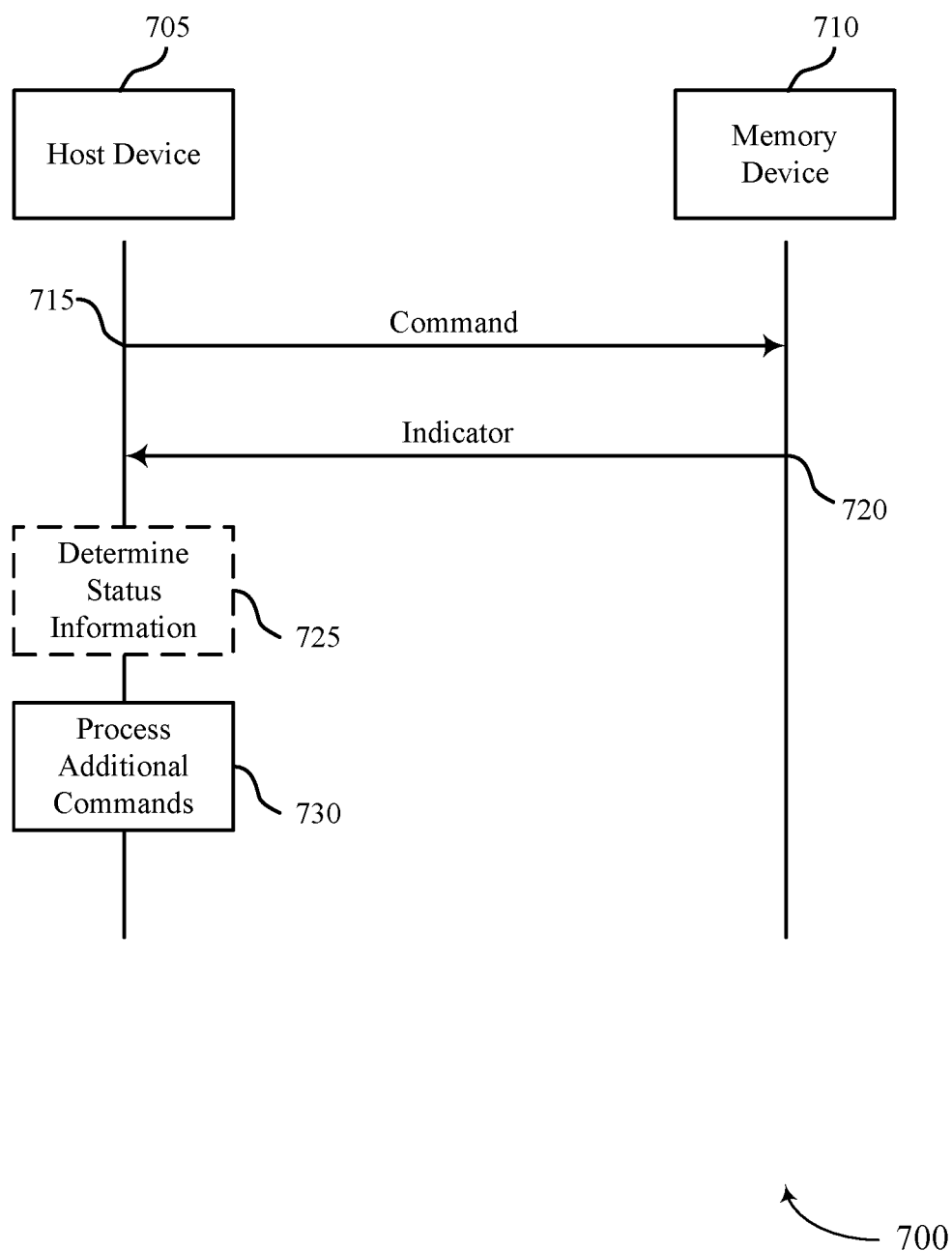

FIG. 7 illustrates an example of a process flow 700 that supports techniques for memory command verification for a memory device. The process flow 700 may implement aspects of the systems 100, 300, and 400, memory sub-array 200, and process flows 500 and 600. The process flow 700 may include operations performed by a host 705, which may be an example of host devices 305, 405, 505, or 605 as described with reference to FIGS. 3 through 6. Host device 705 may implement aspects of the external memory controller 105 as described with reference to FIG. 1; The process flow 700 may further include operations performed by a memory device 710, which may be an example of the memory device 110, the memory array 170, or the memory sub-array 200 as described with reference to FIGS. 1 and 2, and may be examples of memory devices 310, 410, 510, and 610 as described with reference to FIGS. 3 through 6.

At 715, the host device 705 may transmit, to the memory device 710, a command to be executed on a memory array of the memory device 710.

At 720, the host device 705 may receive an indicator from the memory device 710. The indicator may be of a portion of the memory array accessed by the memory device 710 in response to the command. In some cases, the indicator may further include an indicator of a type of access for the portion of the memory array accessed by the memory device 710.

At 725, the host device 705 may optionally determine information indicating a status of execution for the command. The status may be based on the portion of the memory array accessed in response to the command. The information may indicate a MAT or sub-array of the memory array accessed by the memory array in response to the command. In some cases, determining information indicating a status of the execution for the command may include determining whether the portion of the memory array accessed by the memory device 710 is correct for the command. In some cases, determining information indicating the status of execution for the command may include the host device 705 determining whether the type of access is correct for the command. For example, the host device 705 may determine if the type of access command indicated by the memory device 710 is the same as the type of access command indicated by the command at 715.

At 730, the host device 705 may process one or more additional commands for the memory device based on the indicator. In some cases, the host device 705 may process the one or more additional commands for the memory device 710 based on an indication of decoding error for a second command. Here, the host device 705 may have transmitted, to the memory device 710, a second command to be executed on the memory array. The host device 705 may also receive, from the memory device 710, an indicator of a decoding error for the second command.

Figure 8:
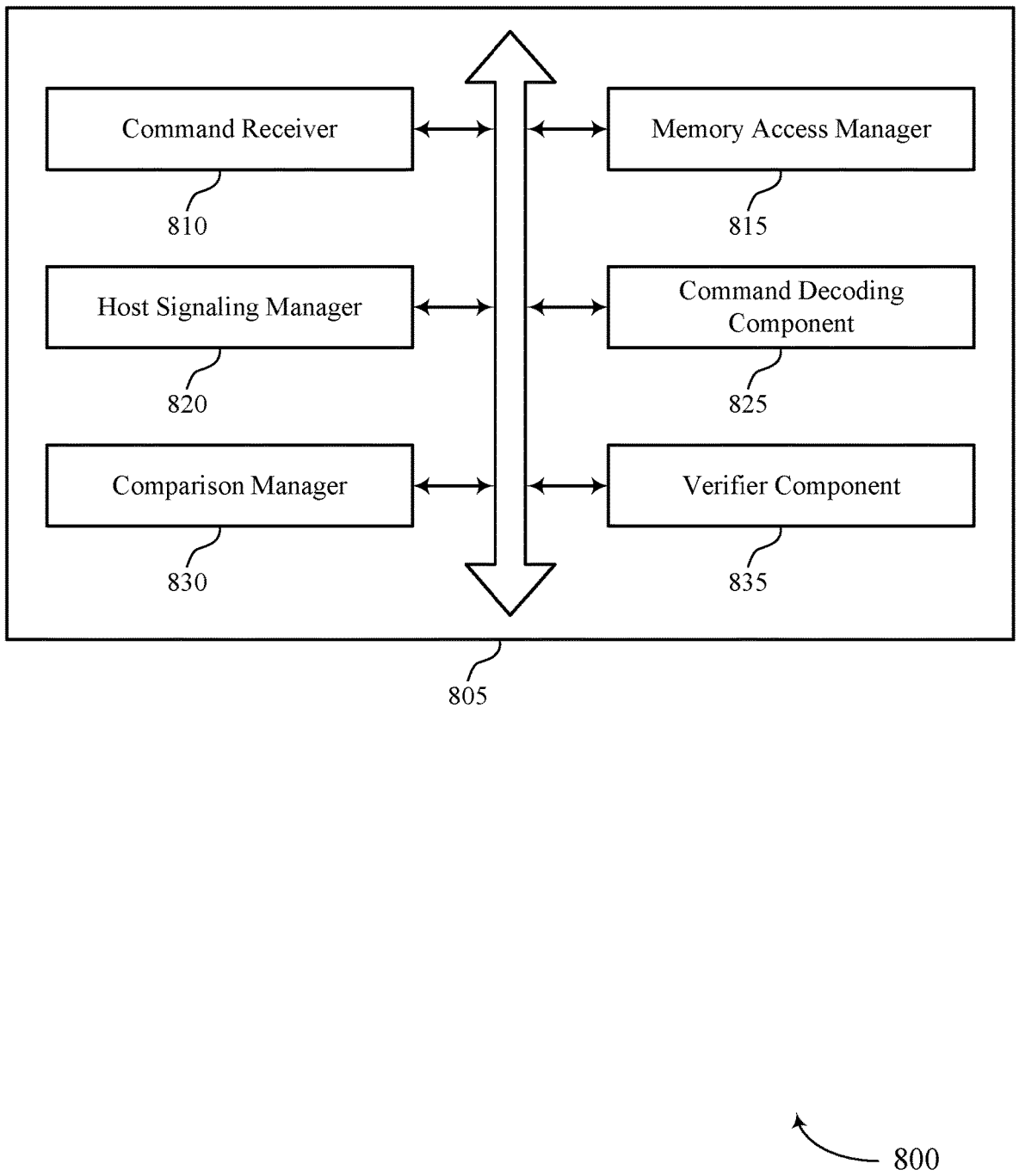
FIGS. 8 and 9 illustrate block diagrams for apparatuses that support memory command verification as disclosed herein.

FIG. 8 shows a block diagram 800 of a device 805 that supports memory command verification as disclosed herein. The device 805 may be an example of aspects of a memory device such as memory device 110, memory device 310, memory device 510, or memory device 610 as disclosed herein with reference to FIGS. 1, 3, 5, and 6. The device 805 may include a command receiver 810, a memory access manager 815, a host signaling manager 820, a command decoding component 825, a comparison manager 830, and a verifier component 835. Each of these modules may communicate, directly or indirectly, with one another (e.g., via one or more buses).

The command receiver 810 may receive a command from a host device at a memory device. In some examples, the command receiver 810 may receive a second command from the host device.

The memory access manager 815 may access a portion of a memory array of the memory device in response to the command. In some examples, the memory access manager 815 may generate an identifier of the portion of the memory array accessed in response to the command. In some cases, the identifier of the portion of the memory array accessed in response to the command is generated at the memory array. In some cases, the identifier of the portion of the memory array accessed in response to the command includes an identifier for one or more dimensions of the memory array. In some cases, the identifier of the portion of the memory array accessed in response to the command includes an indication of a MAT or sub-array of the memory array.

The host signaling manager 820 may transmit signaling to the host device that indicates the portion of the memory array accessed in response to the command. In some cases, the signaling that indicates the portion of the memory array accessed in response to the command includes an indication of a MAT or sub-array of the memory array. In some examples, the signaling transmitted to the host device is based on a comparison of decodes at the one or more decoders and the one or more verifiers. In some examples, the host signaling manager 820 may transmit second signaling to the host device that indicates that decoding of the second command failed to access the memory array.

The command decoding component 825 may decode the command at the memory device, where accessing the portion of the memory array is based on decoding the command. In some examples, the command decoding component 825 may generate an identifier for the command based on decoding the command at the memory device. In some cases, the identifier for the command is generated at one or more decoders of the memory device. In some examples, the command decoding component 825 may decode the command received from the host device at one or more decoders, where accessing the portion of the memory array is based on decoding the command at the one or more decoders.

The comparison manager 830 may compare the identifier to the command received from the host device, where the signaling that indicates the portion of the memory array accessed in response to the command is based on the comparison. In some examples, the comparison manager 830 may compare the identifier for the command to the command received from the host device, where the signaling that indicates the portion of the memory array accessed in response to the command is based on the comparison.

The verifier component 835 may decode the command received from the host device at one or more verifiers.

The command receiver 810 may receive a command at a memory device. In some examples, the command receiver 810 may receive a second command from the host device at the memory device. In some examples, the command receiver 810 may receive a series of commands from the host device, where the series of commands includes the command.

The memory access manager 815 may determine a portion of a memory array that is accessed based on the command. In some examples, the memory access manager 815 may determine a MAT or a sub-array of the memory array corresponding to the portion of the memory array accessed in response to the command. In some examples, the memory access manager 815 may determine a set of columns of the memory array corresponding to the portion of the memory array accessed in response to the command. In some examples, the memory access manager 815 may determine a set of rows of the memory array corresponding to the portion of the memory array accessed in response to the command. In some examples, the memory access manager 815 may determine the MAT or the sub-array based on the set of columns and the set of rows. In some examples, the memory access manager 815 may access respective portions of the memory array in response to the series of commands, where accessing at least one of the respective portions of the memory array occurs concurrently with determining the status.

The host signaling manager 820 may transmit signaling to a host device that indicates the status associated with the command. In some examples, the host signaling manager 820 may transmit, as at least part of the signaling that indicates the status, an indication of an error for the command based on determining a mismatch between the portion of the memory array accessed in response to the command and the location intended to be accessed by the command. In some examples, the host signaling manager 820 may transmit, as at least part of the signaling that indicates the status, a confirmation for the command based on determining that the portion of the memory array accessed in response to the command matches the location intended to be accessed by the command. In some examples, the host signaling manager 820 may transmit, as at least part of the signaling that indicates the status, an error indicator for the command based on determining a mismatch between the type of access and the instruction. In some examples, the host signaling manager 820 may transmit, as at least part of the signaling that indicates the status, a confirmation for the command based on determining that the type of access matches the instruction. In some examples, the host signaling manager 820 may transmit, to the host device, an indicator of a failure to decode the second command. In some cases, the signaling transmitted to the host device includes a status that indicates whether the command received at the memory device was executed correctly or incorrectly within the memory device.

The verifier component 835 may determine a status associated with the command based on the portion of the memory array that is accessed and the command received at the memory device. In some examples, the verifier component 835 may determine the status based on comparing the type of access to the instruction. In some examples, the verifier component 835 may determine the status associated with the command based on the MAT or the sub-array of the memory array.

The command decoding component 825 may decode the command, where the portion of the memory array is accessed based on the decoding the command. In some examples, the command decoding component 825 may determine a location of the memory array intended to be accessed by the command. In some examples, the command decoding component 825 may determine, based on the command received from the host device, an instruction for the access of the memory array. In some examples, the command decoding component 825 may determine a type of access for the portion of the memory array accessed based on decoding the command.

The comparison manager 830 may compare the portion of the memory array accessed based on decoding the command to the location intended to be accessed by the command, where determining the status is based on comparing the portion of the memory array accessed by the command to the location intended to be accessed by the command.

Figure 9:
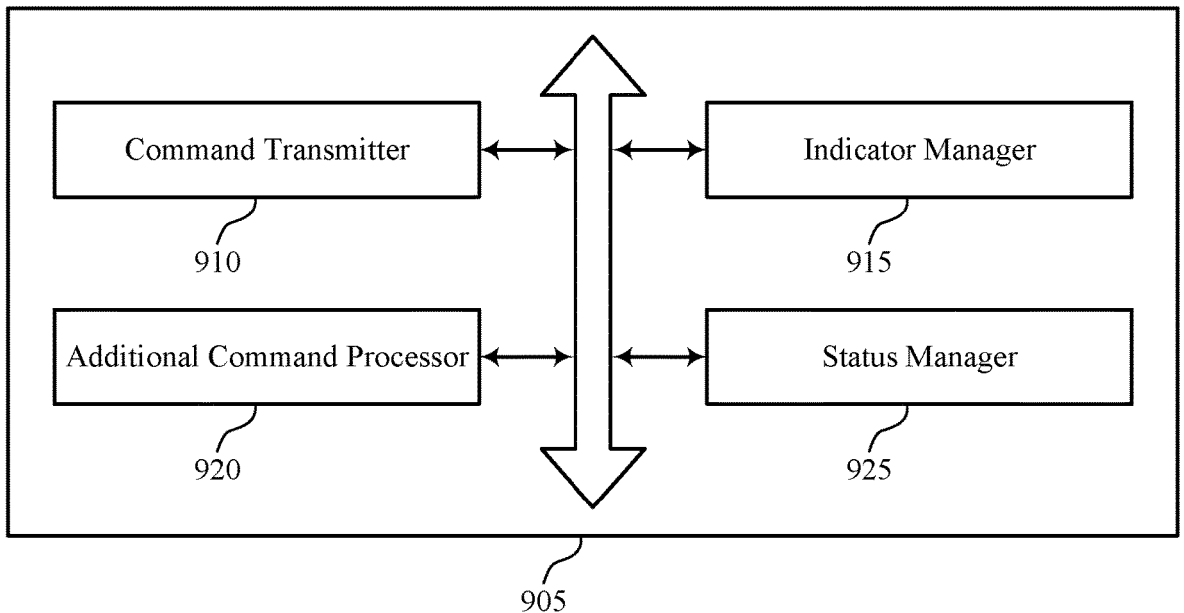

FIG. 9 shows a block diagram 900 of a device 905 that supports memory command verification as disclosed herein. The device 905 may be an example of aspects of a host device such as host device 405 or host device 705 as disclosed herein with reference to FIGS. 4 and 7. The device 905 may include a command transmitter 910, an indicator manager 915, an additional command processor 920, and a status manager 925. Each of these modules may communicate, directly or indirectly, with one another (e.g., via one or more buses).

The command transmitter 910 may transmit, to a memory device, a command to be executed on a memory array of the memory device. In some examples, the command transmitter 910 may transmit, to the memory device, a second command to be executed on the memory array.

The indicator manager 915 may receive, from the memory device, an indicator of a portion of the memory array accessed by the memory device in response to the command. In some examples, the indicator manager 915 may receive, from the memory device, an indicator of a type of access for the portion of the memory array accessed by the memory device. In some examples, the indicator manager 915 may receive, from the memory device, an indicator of a decoding error for the second command.

The additional command processor 920 may process one or more additional commands for the memory device based on the indicator. In some examples, the additional command processor 920 may process the one or more additional commands for the memory device based on the indicator of the decoding error.

The status manager 925 may determine, based on the portion of the memory array accessed in response to the command, information indicating a status of execution for the command. In some cases, the information indicates a MAT or sub-array of the memory array accessed by the memory array in response to the command. In some examples, the status manager 925 may determine whether the portion of the memory array accessed by the memory device is correct for the command, where determining the information is based on determining whether the portion of the memory array accessed by the memory device is correct for the command. In some examples, the status manager 925 may determine whether the type of access is correct for the command, where determining the information is based on determining whether the type of access is correct.

Figure 10:
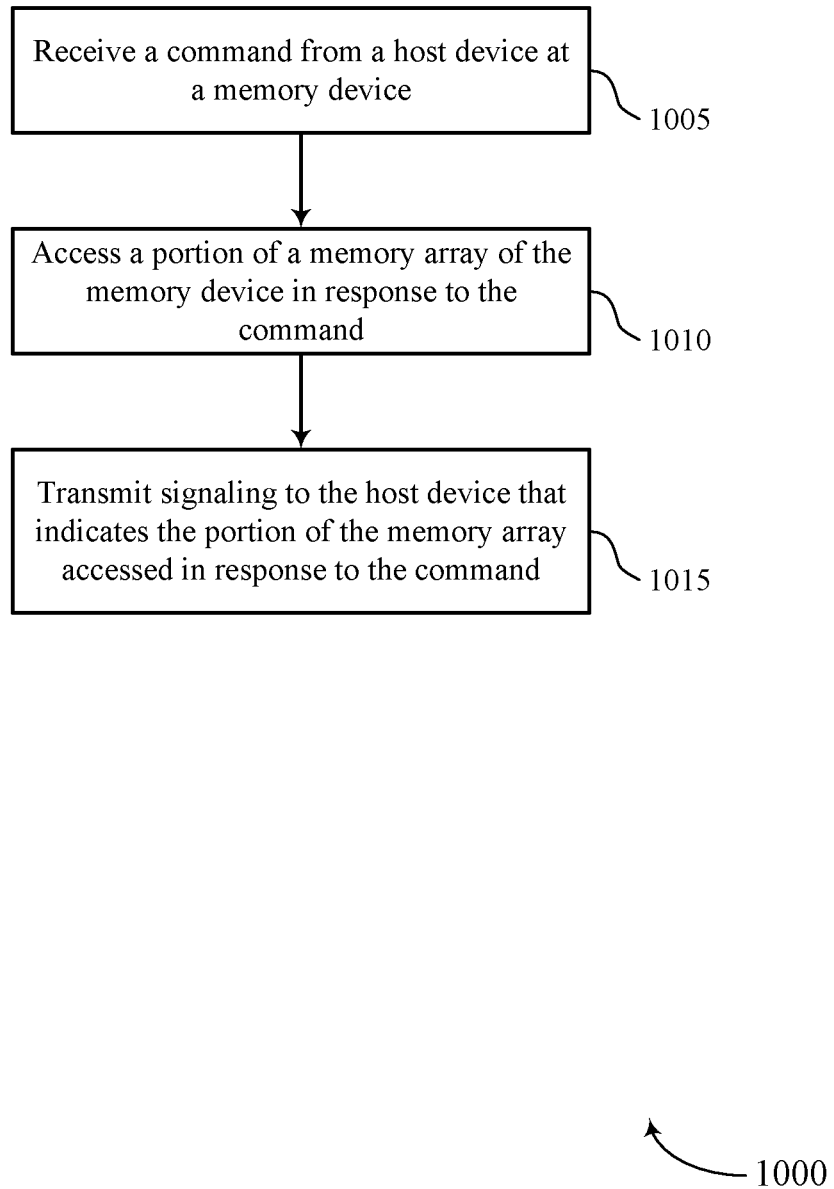
FIGS. 10 through 13 illustrate a method or methods that support memory command verification as disclosed herein.

FIG. 10 shows a flowchart illustrating a method 1000 that supports systems, devices, and methods for memory command verification as disclosed herein. The operations of method 1000 may be implemented by a memory device (e.g., memory device 110, memory device 310, memory device 510, or memory device 610 as disclosed herein with reference to FIGS. 1, 3, 5, and 6) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1005, the memory device may receive a command from a host device at a memory device. The operations of 1005 may be performed according to the methods described herein. In some examples, aspects of the operations of 1005 may be performed by a command receiver as described with reference to FIG. 8.

At 1010, the memory device may access a portion of a memory array of the memory device in response to the command. The operations of 1010 may be performed according to the methods described herein. In some examples, aspects of the operations of 1010 may be performed by a memory access manager as described with reference to FIG. 8.

At 1015, the memory device may transmit signaling to the host device that indicates the portion of the memory array accessed in response to the command. The operations of 1015 may be performed according to the methods described herein. In some examples, aspects of the operations of 1015 may be performed by a host signaling manager as described with reference to FIG. 8.

Figure 11:
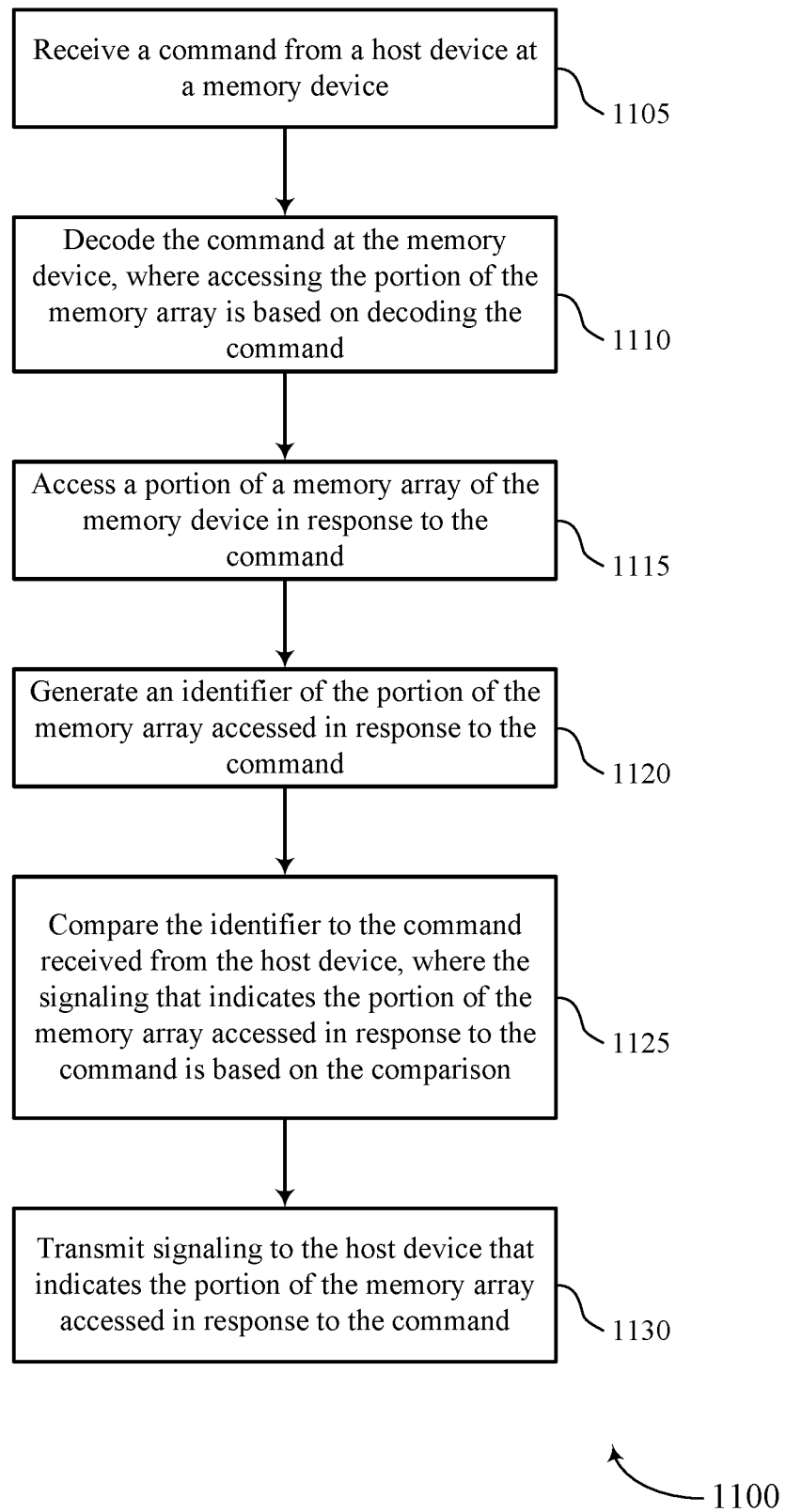

FIG. 11 shows a flowchart illustrating a method 1100 that supports systems, devices, and methods for memory command verification as disclosed herein. The operations of method 1100 may be implemented by a memory device or its components as described herein. For example, the operations of method 1100 may be performed by a memory device as described with reference to FIGS. 1, 3, 4, and 6. In some examples, a memory device may execute a set of instructions to control the functional elements of the memory device to perform the functions described herein. Additionally or alternatively, a memory device may perform aspects of the functions described herein using special-purpose hardware.

At 1105, the memory device may receive a command from a host device at a memory device. The operations of 1105 may be performed according to the methods described herein. In some examples, aspects of the operations of 1105 may be performed by a command receiver as described with reference to FIG. 8.

At 1110, the memory device may decode the command at the memory device, where accessing the portion of the memory array is based on decoding the command. The operations of 1110 may be performed according to the methods described herein. In some examples, aspects of the operations of 1110 may be performed by a command decoding component as described with reference to FIG. 8.

At 1115, the memory device may access a portion of a memory array of the memory device in response to the command. The operations of 1115 may be performed according to the methods described herein. In some examples, aspects of the operations of 1115 may be performed by a memory access manager as described with reference to FIG. 8.

At 1120, the memory device may generate an identifier of the portion of the memory array accessed in response to the command. The operations of 1120 may be performed according to the methods described herein. In some examples, aspects of the operations of 1120 may be performed by a memory access manager as described with reference to FIG. 8.

At 1125, the memory device may compare the identifier to the command received from the host device, where the signaling that indicates the portion of the memory array accessed in response to the command is based on the comparison. The operations of 1125 may be performed according to the methods described herein. In some examples, aspects of the operations of 1125 may be performed by a comparison manager as described with reference to FIG. 8.

At 1130, the memory device may transmit signaling to the host device that indicates the portion of the memory array accessed in response to the command. The operations of 1130 may be performed according to the methods described herein. In some examples, aspects of the operations of 1130 may be performed by a host signaling manager as described with reference to FIG. 8.

An apparatus for performing a method or methods, such as the method 1100, is described. The apparatus may include means for include means for receiving a command from a host device at a memory device, accessing a portion of a memory array of the memory device in response to the command, and transmitting signaling to the host device that indicates the portion of the memory array accessed in response to the command.

In some examples, the apparatus may include features for decoding the command at the memory device, where accessing the portion of the memory array may be based on decoding the command, generating an identifier of the portion of the memory array accessed in response to the command and comparing the identifier to the command received from the host device, where the signaling that indicates the portion of the memory array accessed in response to the command may be based on the comparison.

In some cases, the identifier of the portion of the memory array accessed in response to the command may be generated at the memory array. In some instances, the identifier of the portion of the memory array accessed in response to the command includes an identifier for one or more dimensions of the memory array. In some examples, the identifier of the portion of the memory array accessed in response to the command includes an indication of a MAT or sub-array of the memory array.

In some examples, the apparatus may include features for generating an identifier for the command based on decoding the command at the memory device and comparing the identifier for the command to the command received from the host device, where the signaling that indicates the portion of the memory array accessed in response to the command may be based on the comparison.

In some cases, the identifier for the command may be generated at one or more decoders of the memory device.

In some examples, the apparatus may include features for decoding the command received from the host device at one or more decoders, where accessing the portion of the memory array may be based on decoding the command at the one or more decoders, decoding the command received from the host device at one or more verifiers, and where the signaling transmitted to the host device may be based on a comparison of decodes at the one or more decoders and the one or more verifiers.

In some cases, the signaling transmitted to the host device includes a status that indicates whether the command received at the memory device was executed correctly or incorrectly within the memory device.

In some instances, the signaling that indicates the portion of the memory array accessed in response to the command includes an indication of a MAT or sub-array of the memory array.

In some examples, the apparatus may include features for receiving a second command from the host device at the memory device and transmitting second signaling to the host device that indicates that decoding of the second command failed to access the memory array.

Figure 12:
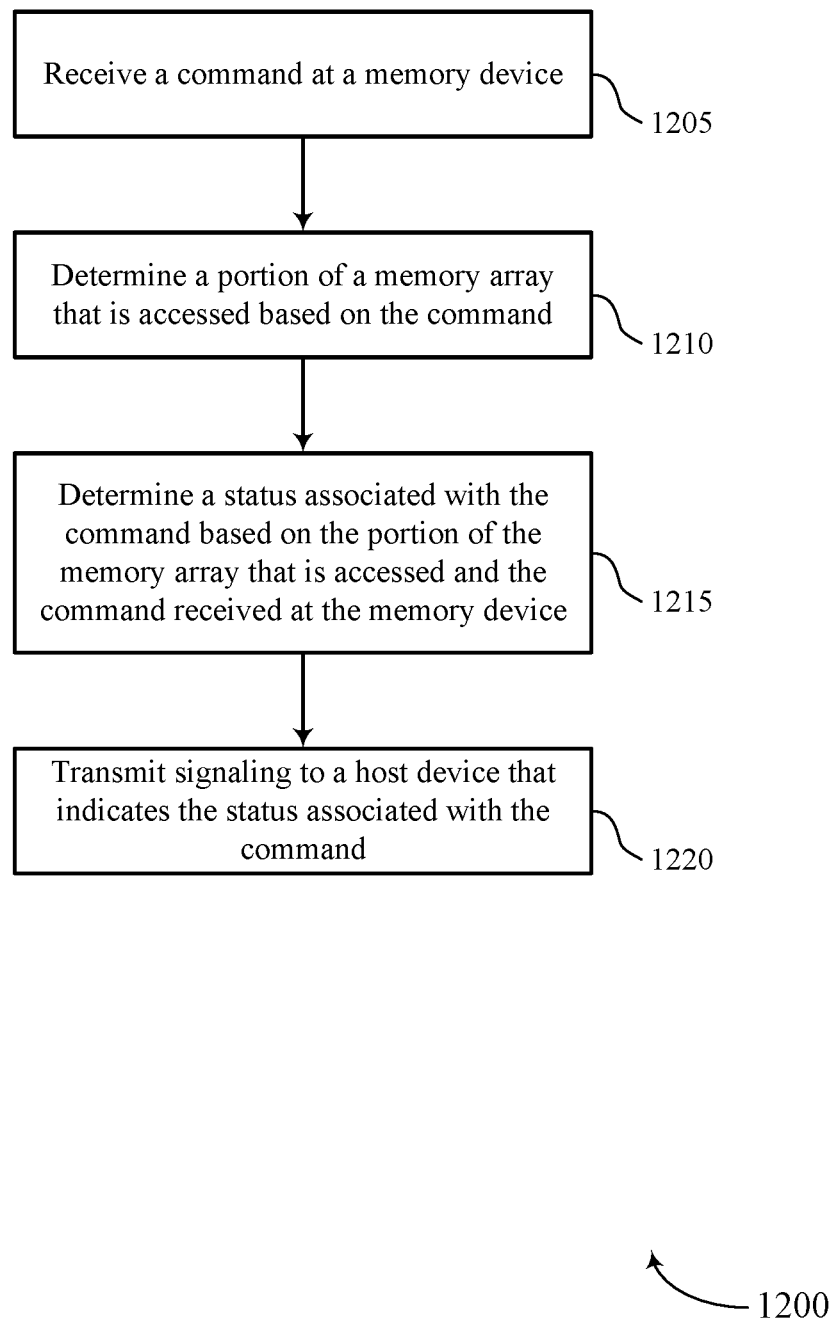

FIG. 12 shows a flowchart illustrating a method 1200 that supports systems, devices, and methods for memory command verification as disclosed herein. The operations of method 1200 may be implemented by a memory device or its components as described herein. For example, the operations of method 1200 may be performed by a memory device as described with reference to FIGS. 1, 3, 5, and 6. In some examples, a memory device may execute a set of instructions to control the functional elements of the memory device to perform the functions described herein. Additionally or alternatively, a memory device may perform aspects of the functions described herein using special-purpose hardware.

At 1205, the memory device may receive a command at a memory device. The operations of 1205 may be performed according to the methods described herein. In some examples, aspects of the operations of 1205 may be performed by a command receiver as described with reference to FIG. 8.

At 1210, the memory device may determine a portion of a memory array that is accessed based on the command. The operations of 1210 may be performed according to the methods described herein. In some examples, aspects of the operations of 1210 may be performed by a memory access manager as described with reference to FIG. 8.

At 1215, the memory device may determine a status associated with the command based on the portion of the memory array that is accessed and the command received at the memory device. The operations of 1215 may be performed according to the methods described herein. In some examples, aspects of the operations of 1215 may be performed by a verifier component as described with reference to FIG. 8.

At 1220, the memory device may transmit signaling to a host device that indicates the status associated with the command. The operations of 1220 may be performed according to the methods described herein. In some examples, aspects of the operations of 1220 may be performed by a host signaling manager as described with reference to FIG. 8.

An apparatus for performing a method or methods, such as the method 1200, is described. The apparatus may include means for receiving a command at a memory device, determining a portion of a memory array that is accessed based on the command, determining a status associated with the command based on the portion of the memory array that is accessed and the command received at the memory device, and transmitting signaling to a host device that indicates the status associated with the command.

In some cases, the apparatus may include features for decoding the command, where the portion of the memory array may be accessed based on the decoding the command.

In some examples, the apparatus may include features for determining a location of the memory array intended to be accessed by the command and comparing the portion of the memory array accessed based on decoding the command to the location intended to be accessed by the command, where determining the status may be based on comparing the portion of the memory array accessed by the command to the location intended to be accessed by the command.

In some instances, the apparatus may include features for transmitting, as at least part of the signaling that indicates the status, a confirmation for the command based on determining that the portion of the memory array accessed in response to the command matches the location intended to be accessed by the command.

In some cases, the apparatus may include features for transmitting, as at least part of the signaling that indicates the status, a confirmation for the command based on determining that the portion of the memory array accessed in response to the command matches the location intended to be accessed by the command.

In some examples, the apparatus may include features for determining, based on the command received from the host device, an instruction for the access of the memory array, determining a type of access for the portion of the memory array accessed based on decoding the command and determining the status based on comparing the type of access to the instruction.

In some instances, the apparatus may include features for transmitting, as at least part of the signaling that indicates the status, an error indicator for the command based on determining a mismatch between the type of access and the instruction.

In some cases, the apparatus may include features for transmitting, as at least part of the signaling that indicates the status, a confirmation for the command based on determining that the type of access matches the instruction.

In some examples, the apparatus may include features for receiving a second command from the host device and transmitting, to the host device, an indicator of a failure to decode the second command.

In some instances, the apparatus may include features for determining a MAT or a sub-array of the memory array corresponding to the portion of the memory array accessed in response to the command and determining the status associated with the command based on the MAT or the sub-array of the memory array.

In some cases, the apparatus may include features for determining a set of columns of the memory array corresponding to the portion of the memory array accessed in response to the command, determining a set of rows of the memory array corresponding to the portion of the memory array accessed in response to the command and determining the MAT or the sub-array based on the set of columns and the set of rows.

In some examples, the apparatus may include features for receiving a series of commands from the host device, where the series of commands includes the command and accessing respective portions of the memory array in response to the series of commands, where accessing at least one of the respective portions of the memory array occurs concurrently with determining the status.

Figure 13:
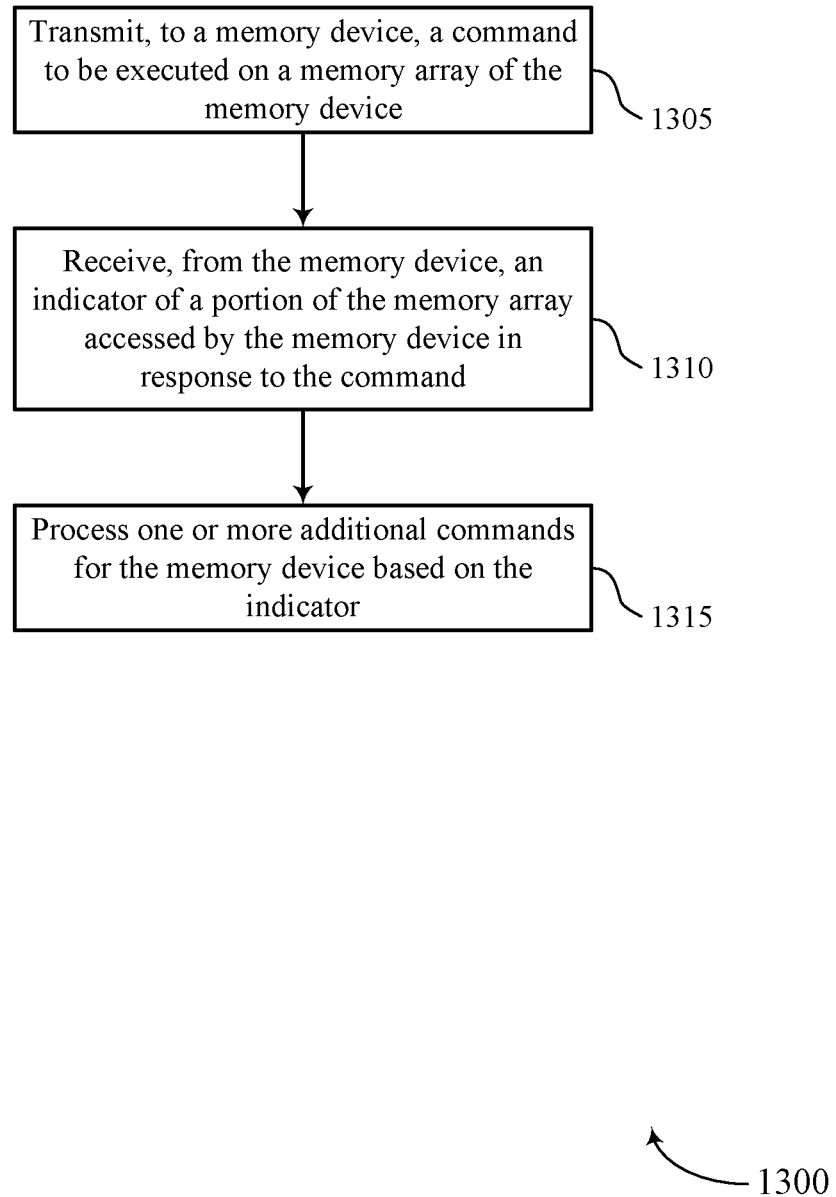

FIG. 13 shows a flowchart illustrating a method 1300 that supports systems, devices, and methods for memory command verification as disclosed herein. The operations of method 1300 may be implemented by a host device or its components as described herein. For example, the operations of method 1300 may be performed by a host device as described with reference to FIGS. 4 and 7. In some examples, a host device may execute a set of instructions to control the functional elements of the host device to perform the functions described herein. Additionally or alternatively, a host device may perform aspects of the functions described herein using special-purpose hardware.

At 1305, the host device may transmit, to a memory device, a command to be executed on a memory array of the memory device. The operations of 1305 may be performed according to the methods described herein. In some examples, aspects of the operations of 1305 may be performed by a command transmitter as described with reference to FIG. 9.

At 1310, the host device may receive, from the memory device, an indicator of a portion of the memory array accessed by the memory device in response to the command. The operations of 1310 may be performed according to the methods described herein. In some examples, aspects of the operations of 1310 may be performed by an indicator manager as described with reference to FIG. 9.

At 1315, the host device may process one or more additional commands for the memory device based on the indicator. The operations of 1315 may be performed according to the methods described herein. In some examples, aspects of the operations of 1315 may be performed by an additional command processor as described with reference to FIG. 9.

An apparatus for performing a method or methods, such as the method 1300, is described. The apparatus may include means for transmitting, to a memory device, a command to be executed on a memory array of the memory device, receiving, from the memory device, an indicator of a portion of the memory array accessed by the memory device in response to the command, and processing one or more additional commands for the memory device based on the indicator.

In some examples, the apparatus may include features for determining, based on the portion of the memory array accessed in response to the command, information indicating a status of execution for the command. In some cases, the information indicates a MAT or sub-array of the memory array accessed by the memory array in response to the command.

In some instances the apparatus may include features for determining whether the portion of the memory array accessed by the memory device may be correct for the command, where determining the information may be based on determining whether the portion of the memory array accessed by the memory device may be correct for the command.

In some cases, the apparatus may include features for receiving, from the memory device, an indicator of a type of access for the portion of the memory array accessed by the memory device and determining whether the type of access may be correct for the command, where determining the information may be based on determining whether the type of access may be correct.

In some examples, the apparatus may include features for transmitting, to the memory device, a second command to be executed on the memory array, receiving, from the memory device, an indicator of a decoding error for the second command and processing the one or more additional commands for the memory device based on the indicator of the decoding error.

It should be noted that the methods described above describe possible implementations, and that the operations and the steps may be rearranged or otherwise modified and that other implementations are possible. Further, aspects from two or more of the methods may be combined.

In some examples, an apparatus for memory command verification may perform aspects of the functions described herein using general- or special-purpose hardware. The apparatus may include an interface coupled with a host device and operable to receive a command from the host device, a memory array coupled with the interface and operable to receive the command and determine a portion of the memory array that is accessed based on the command, and circuitry coupled with the memory array and operable to transmit, to the host device, signaling that indicates the portion of the memory array accessed based on the command.

In some cases, the signaling that indicates the portion of the memory array accessed based on the command includes an indication of a MAT or sub-array of the memory array.

In some examples, the signaling that indicates the portion of the memory array accessed based on the command includes an identifier for one or more dimensions of the memory array.

In some other examples, an apparatus for memory command verification may perform aspects of the functions described herein using general- or special-purpose hardware. The apparatus may include an interface coupled with a host device and operable to receive a command from the host device, a decoder coupled with the interface and operable to obtain a decoded command for memory access based on the command, a memory array coupled with the decoder and operable to receive the decoded command and determine a portion of the memory array accessed by the decoded command, a verifier coupled with the interface and the memory array and operable to, receiving the command from the interface, determining a status associated with the memory access based on the indicator of the portion of the memory array accessed by the command and the command, and transmitting an indicator of the status to the host device.

In some cases, the verifier may be operable to determine a location of the memory array intended to be accessed by the command and determine the status based on comparing the portion of the memory array accessed by the decoded command to the location intended to be accessed by the command.

In some instances, the verifier may be operable to determine an instruction for the access of the memory array according to the command, receive, from the memory array, a type of access for the portion of the memory array accessed in response to the decoded command and determine the status based on comparing the type of access to the instruction.

In some examples, the decoder may be further operable to determine a failure to decode a second command, the second command received by the interface from the host device and the verifier may be further operable to transmit, to the host device, an indicator of the failure to decode the second command.

In some cases, the memory array may be further operable to determine a MAT or a sub-array of the memory array corresponding to the portion of the memory array accessed in response to the command and the verifier may be further operable to determine the status associated with the command based on the MAT or the sub-array of the memory array.

Although certain features may be described herein with respect to or in the context of DRAM technology, this is for illustrative purposes only, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving a command from a host device;
   accessing a portion of a memory array of a memory device in response to the command;
   generating an identifier of the portion of the memory array accessed in response to the command;
   comparing the identifier to the command received from the host device; and
   transmitting signaling to the host device that indicates the portion of the memory array accessed in response to the command, wherein the signaling is based at least in part on the comparing.

2. The method of claim 1, further comprising:
   decoding the command at one or more decoders, wherein accessing the portion of the memory array is based at least in part on decoding the command at the one or more decoders; and
   decoding the command at one or more verifiers, wherein the signaling transmitted to the host device is based at least in part on a comparison of decodes at the one or more decoders and the one or more verifiers.

3. The method of claim 2, wherein the signaling transmitted to the host device comprises an indication of an error, based at least in part on the comparison of decodes at the one or more decoders and the one or more verifiers.

4. The method of claim 1, wherein the signaling transmitted to the host device comprises a status that indicates whether the command received at the memory device was executed correctly or incorrectly within the memory device.

5. A method, comprising:
   receiving a command from a host device;
   decoding the command at a memory device;
   accessing a portion of a memory array of the memory device in response to the command;
   generating an identifier of the portion of the memory array accessed in response to the command;
   comparing the identifier to the command received from the host device; and
   transmitting signaling to the host device that indicates the portion of the memory array accessed in response to the command, wherein the signaling is based at least in part on decoding the command.

6. The method of claim 5, further comprising:
   generating a second identifier for the command based at least in part on decoding the command at the memory device; and
   comparing the second identifier for the command to the command received from the host device, wherein the signaling that indicates the portion of the memory array accessed in response to the command is based at least in part on the comparing of the second identifier for the command to the command received from the host device.

7. A method, comprising:
   receiving a command from a host device;
   accessing a portion of a memory array of a memory device in response to the command;
   generating an identifier of the portion of the memory array accessed in response to the command;
   comparing the identifier to the command received from the host device;
   receiving a second command from the host device; and
   transmitting signaling to the host device that indicates that decoding of the second command failed to access the memory array.

8. A method, comprising:
   receiving a command at a memory device, the command associated with a first location of a memory array;
   determining a second location of the memory array that is accessed based on receiving the command;
   determining a status associated with the command based at least in part on comparing the first location and the second location; and
   transmitting signaling to a host device that indicates the status associated with the command.

9. The method of claim 8, further comprising:
   decoding the command, wherein the second location is accessed based at least in part on the decoding the command.

10. The method of claim 8, further comprising:
    transmitting, as at least part of the signaling that indicates the status, an indication of an error for the command or a confirmation for the command.

11. The method of claim 8, further comprising:

determining, based at least in part on the command, an instruction for access of the memory array; and determining the status based at least in part on comparing a type of access for the second location to the instruction.

12. The method of claim 11, further comprising:

transmitting, as at least a part of the signaling that indicates the status, an error indicator for the command or a confirmation for the command.

13. The method of claim 8, further comprising:

determining a matrix (MAT) or a sub-array of the memory array corresponding to the second location of the memory array; and determining the status associated with the command based at least in part on the MAT or the sub-array of the memory array.

14. The method of claim 8, further comprising:

receiving a series of commands from the host device, wherein the series of commands comprises the command; and accessing respective locations of the memory array in response to the series of commands, wherein accessing at least one of the respective locations occurs concurrently with determining the status.

15. A device, comprising:

an interface coupled with a host device and configured to receive a command from the host device;

a memory array coupled with the interface and configured to:

receive the command at a memory device, the command associated with a first location of the memory array;

determine a second location of the memory array that is accessed based on receiving the command; and determine a status associated with the command based at least in part on comparing the first location and the second location; and circuitry coupled with the memory array and configured to transmit signaling to the host device that indicates the status associated with the command.

16. The device of claim 15, wherein the memory array is further configured to:

decode the command, wherein the second location is accessed based at least in part on the decoding the command.

17. The device of claim 15, wherein the memory array is further configured to:

determine, based at least in part on the command, an instruction for access of the memory array; and determine the status based at least in part on comparing a type of access for the second location to the instruction.

18. The device of claim 15, wherein the circuitry coupled with the memory array is further configured to:

transmit, as at least part of the signaling that indicates the status, an indication of an error for the command or a confirmation for the command.

19. The device of claim 15, wherein the memory array is further configured to:

determine a matrix (MAT) or a sub-array of the memory array corresponding to the second location of the memory array; and determine the status associated with the command based at least in part on the MAT or the sub-array of the memory array.

* * * * *